US 8,871,590 B2

(12) United States Patent
Choi et al.

(10) Patent No.: US 8,871,590 B2
(45) Date of Patent: Oct. 28, 2014

(54) THIN FILM TRANSISTOR ARRAY SUBSTRATE, LIQUID CRYSTAL DISPLAY DEVICE INCLUDING THE SAME AND FABRICATING METHODS THEREOF

(75) Inventors: Jun Ho Choi, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 912 days.

(21) Appl. No.: 12/904,588

(22) Filed: Oct. 14, 2010

(65) Prior Publication Data

US 2011/0156995 A1  Jun. 30, 2011

(30) Foreign Application Priority Data

Dec. 31, 2009  (KR) .................. 10-2009-0135681
May 14, 2010  (KR) .................. 10-2010-0045359

(51) Int. Cl.
*H01L 21/336*  (2006.01)
*H01L 27/12*  (2006.01)
*G02F 1/1343*  (2006.01)
*G02F 1/1362*  (2006.01)

(52) U.S. Cl.
CPC ...... *G02F 1/136227* (2013.01); *H01L 27/1214* (2013.01); *H01L 27/12* (2013.01); *G02F 1/136213* (2013.01); *G02F 2201/40* (2013.01); *G02F 1/134363* (2013.01)
USPC ............. 438/268; 257/E21.625; 257/E27.081

(58) Field of Classification Search
CPC .............. H01L 27/124; H01L 27/3244; H01L 27/3246; H01L 27/3248; H01L 27/3262
See application file for complete search history.

(56) References Cited

U.S. PATENT DOCUMENTS

| 2005/0142714 A1* | 6/2005 | Chae et al. ............. 438/197 |
| 2009/0128018 A1* | 5/2009 | Lee ........................ 313/504 |
| 2011/0156040 A1* | 6/2011 | Kwack et al. ............ 257/59 |
| 2011/0156165 A1* | 6/2011 | Jang et al. .............. 257/389 |

FOREIGN PATENT DOCUMENTS

| KR | 200514198 A | 4/2005 |
| TW | I249814 B   | 2/2006 |

OTHER PUBLICATIONS

Taiwanese Office Action issued in Taiwan Patent Application No. 099132419 on Jun. 9, 2014.

* cited by examiner

*Primary Examiner* — Kevin M Picardat
*Assistant Examiner* — Pamela E Perkins
(74) *Attorney, Agent, or Firm* — Morgan, Lewis & Bockius LLP

(57) ABSTRACT

A thin film transistor array substrate includes a substrate, a gate line and a data line arranged to cross each other and to define a pixel region on the substrate, a first common line disposed to be parallel to the gate line and to cross the data line, a switch element disposed at an intersection of the gate line and data line, a first pixel electrode formed to overlap the first common line, and a second pixel electrode branched from the first pixel electrode in a plurality of strips, a second common line opposite to the first common line in the center of the pixel region, a second common electrode branched from the second common line toward the pixel region into a plurality of strips, and a third common electrode branched to overlap the data line from the second common line, and a first storage electrode branched from the first common line into the pixel region, and a second storage electrode extended to overlap the first storage electrode from the first pixel electrode.

10 Claims, 18 Drawing Sheets

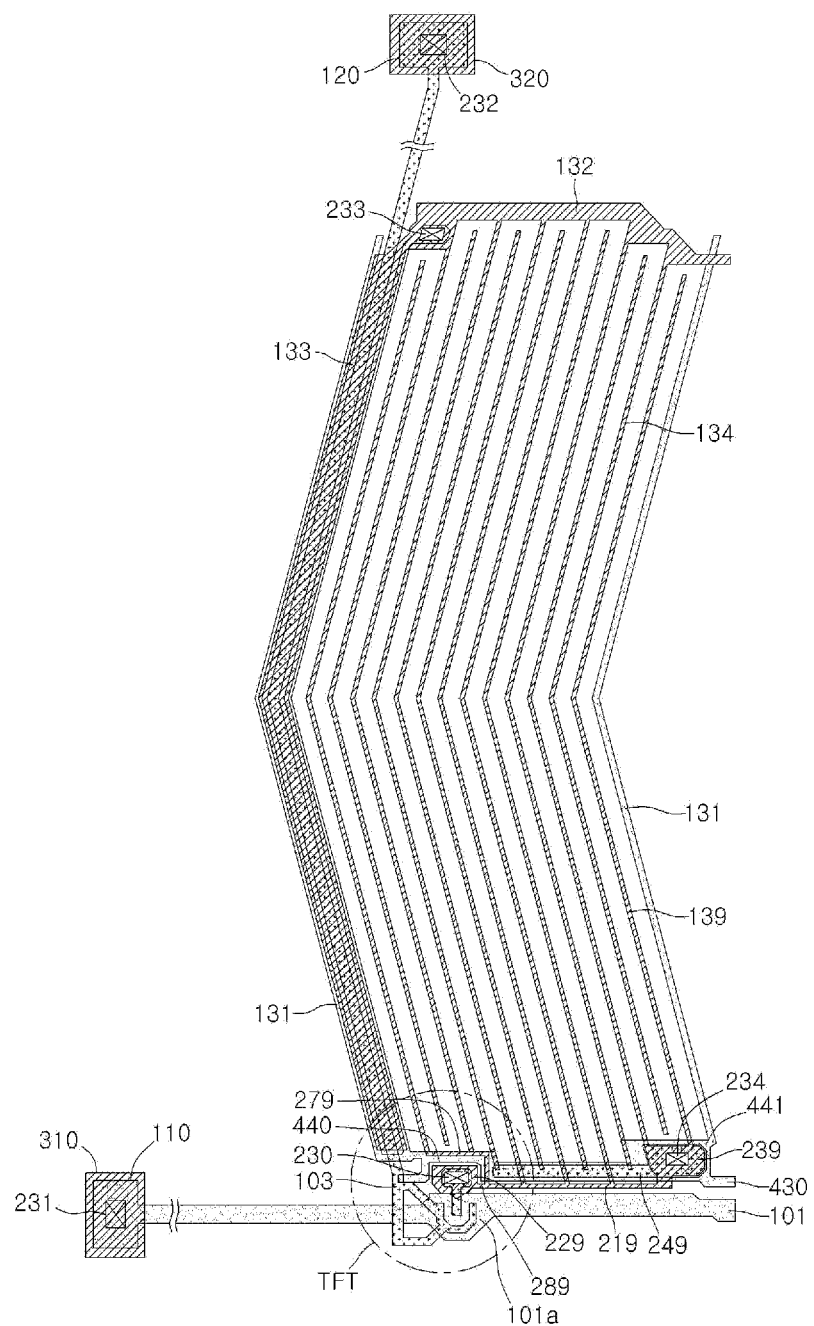

THIN FILM TRANSISTOR ARRAY SUBSTRATE, LIQUID CRYSTAL DISPLAY DEVICE INCLUDING THE SAME AND FABRICATING METHODS THEREOF

This application claims the benefit of the Korean Patent Application No. 10-2009-0135681, filed on Dec. 31, 2009, and Korean Patent Application No. 10-2010-0045359, filed on May 14, 2010, which are hereby incorporated by reference in their entirety.

BACKGROUND OF THE INVENTION

1. Field of the Invention

The present invention relates generally to a thin film transistor array substrate, a liquid crystal display (LCD) device having the substrate and fabricating methods thereof, and more particularly to a thin film transistor array substrate, a liquid crystal display (LCD) device having the substrate and fabricating methods thereof, which are capable of improving an aperture ratio of a pixel region.

2. Background of the Related Art

In general, an LCD device controls light transmittance of a liquid crystal with a dielectric anisotropy using an electric field, thereby displaying an image. The LCD device is usually fabricated such that a color filter array substrate and a thin film transistor array substrate are combined together with a liquid crystal layer being disposed between the two substrates.

In the related art, an LCD device with a narrow viewing angle is regarded as a TN (Twisted Nematic) mode LCD device. LCD devices with wide viewing angle characteristics are usually classified into an in-plane switching (IPS) mode, an optically compensated birefringence (OCB) mode, a fringe field switching (FFS) mode, etc.

Among the LCD devices with the wide viewing angles, the IPS mode LCD device allows a pixel electrode and a common electrode to be arranged on the same substrate so that a horizontal electric field is induced between the electrodes. As such, major axes of liquid crystal molecules are aligned in a horizontal direction with respect to the substrate. Accordingly, the IPS mode LCD device has a wider viewing angle than that of the TN mode LCD device.

FIG. 1 is a view schematically showing a pixel structure in an IPS mode LCD device according to the related art. FIG. 2 is a cross-sectional view schematically showing the pixel structure taken along a line I-I' of FIG. 1.

As shown in FIG. 1, a gate line 1 and a data line 5 cross each other, thereby defining a pixel region. A thin film transistor TFT is disposed as a switching element at an intersection of the gate and data lines 1 and 5. On the pixel region, a first common line 3 is opposite to the gate line 1 and crosses the data line 5. First common electrodes 3a, which are branched from the first common line 3 and parallel to the data line 5, are formed on both sides of the pixel region. The gate line 1 may be configured to include a gate electrode 1a with a width. A first storage electrode 6 is disposed adjacent to the gate electrode 1a, and is formed in a single body with the first common electrodes 3a.

Also, a second common line 13 for electrically contacting the first common line 3 is formed over the first common line 3. A second common electrode 13a is branched from the second common line 13 and formed on the pixel region. In addition, third common electrodes 13b are branched from the second common line 13 and partially overlap the first common electrodes 3a. The second common electrode 13a is alternately disposed with pixel electrodes 7a in the pixel region. A second storage electrode 7 overlaps with the first storage electrode 6. The pixel electrodes 7a are branched from the second storage electrode 7.

As shown in FIG. 2, which is the cross-sectional view taken along the line I-I' in a region of the data line 5, a gate insulation film 12 is formed on a lower substrate 10. The data line 5 is formed on the gate insulation film 10. The first common electrodes 3a arranged at both sides of the data line 5 are formed on the lower substrate 10. The third common electrodes 13b are formed on a protective (or passivation) film 19 and partially overlap the first common electrodes 3a.

The color filter array substrate may be configured to include an upper substrate 20 and a black matrix 21 that is opposite to the data line 5. The black matrix 21 is formed on the upper substrate 20. A red (R) color filter layer 25a and a green (G) color filter layer 25b are formed by both side of the black matrix 21. A reference numeral "29" denotes an overcoat layer.

Such an IPS mode LCD device of the related art forces a width L1 of the black matrix 21 to become larger, in order to prevent light leakage caused by light that is generated in a backlight unit and passes around the edges of the pixel region. More specifically, the black matrix 21 is formed to reach to an edge of the first common electrode 3a so as to intercept light passing between the data line 5 and the first common electrode 3a in a direction inclined by at least a constant angle with respect to a vertical line. Such a structure arrangement decreases an aperture ratio of the pixel region. In addition, since the pixel electrodes and the common electrodes arranged in the pixel region are formed in a single metal layer, it is difficult to improve the aperture ratio of the pixel region by reducing the width of the electrodes.

SUMMARY OF THE INVENTION

Accordingly, the present exemplary embodiments are directed to an LCD device that substantially obviates one or more of problems due to the limitations and disadvantages of the related art.

An object of the present invention is to provide a thin film transistor substrate, an LCD device including the same, and fabricating methods thereof that are adapted to improve the aperture ratio by forming a common electrode which overlaps a data line on a substrate.

Another object of the present invention is to provide a thin film transistor substrate, an LCD device including the same, and fabricating methods thereof that are adapted to reduce a parasitic capacitance by disposing an organic insulation film between a data line and a common electrode.

Still another object of the present invention is to provide a thin film transistor substrate, an LCD device including the same, and fabricating methods thereof that are adapted to include a fine width of an electrode by forming common and pixel electrodes, which are arranged on an upper portion of the substrate, in a double-stacked metal layer.

Further still another object of the present invention is to provide an LCD device and a fabricating method thereof that are adapted to improve the aperture ratio by removing a black matrix opposite to a data line from a color filter substrate.

Furthermore, still another object of the present invention is to provide a thin film transistor substrate, an LCD device including the same, and fabricating methods thereof that are adapted to easily perform a process of repairing a dark spot without removing an organic insulation film.

Additional features and advantages of the present invention will be set forth in the description which follows, and in part will be apparent from the description, or may be learned by practice of the exemplary embodiments of the present invention. The advantages of the embodiments will be realized and attained by the structure particularly pointed out in the written description and claims hereof as well as the appended drawings.

According to one general aspect of the present invention, a thin film transistor array substrate includes: a substrate defined into a display area and a non-display area; a gate line and a data line arranged to cross each other and to define a pixel region in the display area of the substrate; a first common line formed to be parallel to the gate line and to cross the data line; first common electrodes formed at both sides of the data line and extended from the first common line parallel to the data line; a switch element disposed at an intersection of the gate line and the data line; a first pixel electrode formed parallel to the gate line; a second pixel electrode extended from the first pixel electrode and disposed parallel to the data line; a second common line formed opposite to the first common line in the pixel region; a second common electrode extended from the second common line toward the pixel region; a third common electrode extended from the second common line and disposed to overlap the data line, which is covered with an organic insulation film being interposed between the third common electrode and the data line, and spaces between the data line and the first common electrodes; a first storage electrode extended from the first common line into the pixel region; and a second storage electrode formed to overlap the first storage electrode.

A fabricating method of thin film transistor array substrate according to one general aspect of the present exemplary embodiment includes: providing a substrate defined into a display area and a non-display area; forming a first metal layer on the substrate, and patterning the first metal layer into a gate electrode, a gate line, and a first common electrode which are arranged on the display area, and a gate pad on the non-display area through a first mask process; sequentially forming a gate insulation film, a semiconductor layer, and a second metal layer on the substrate and forming source/drain electrodes, a second storage electrode, a channel layer, and a data line from the second metal layer and the semiconductor layer through a second mask process; sequentially forming a protective film and an organic insulation film on the substrate, and patterning the patterning the organic insulation film by performing exposing and developing steps according to a third mask process; sequentially performing first and second etching steps in which the patterned organic insulation film is used as an etch mask by using etching gases with different oxygen content ratios, in order to form contact holes in a drain electrode region, a gate pad region, and a data pad region; and sequentially forming a third metal layer and a fourth metal layer on the organic insulation film with the contact holes, and then patterning the third and fourth metal layers into a pixel electrode and a second common electrode through a fourth mask process.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the exemplary embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings:

FIG. 16A is a view schematically showing a pixel region in an LCD device according to a fourth exemplary embodiment of the present invention;

DETAILED DESCRIPTION OF THE PREFERRED EMBODIMENTS

Figure 1:
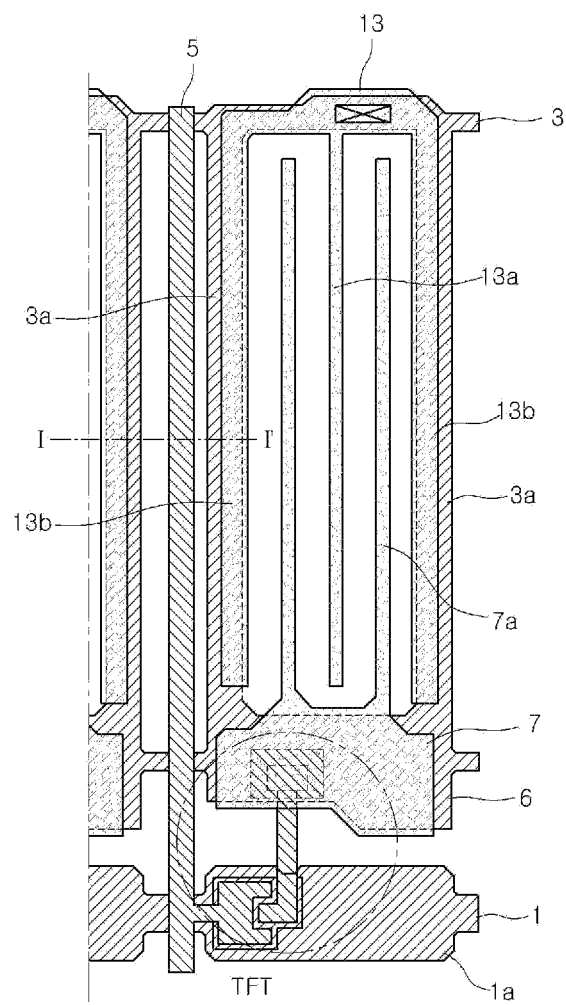
FIG. 1 is a view schematically showing a pixel structure in an LCD device of IPS mode according to the related art.
Figure 2:
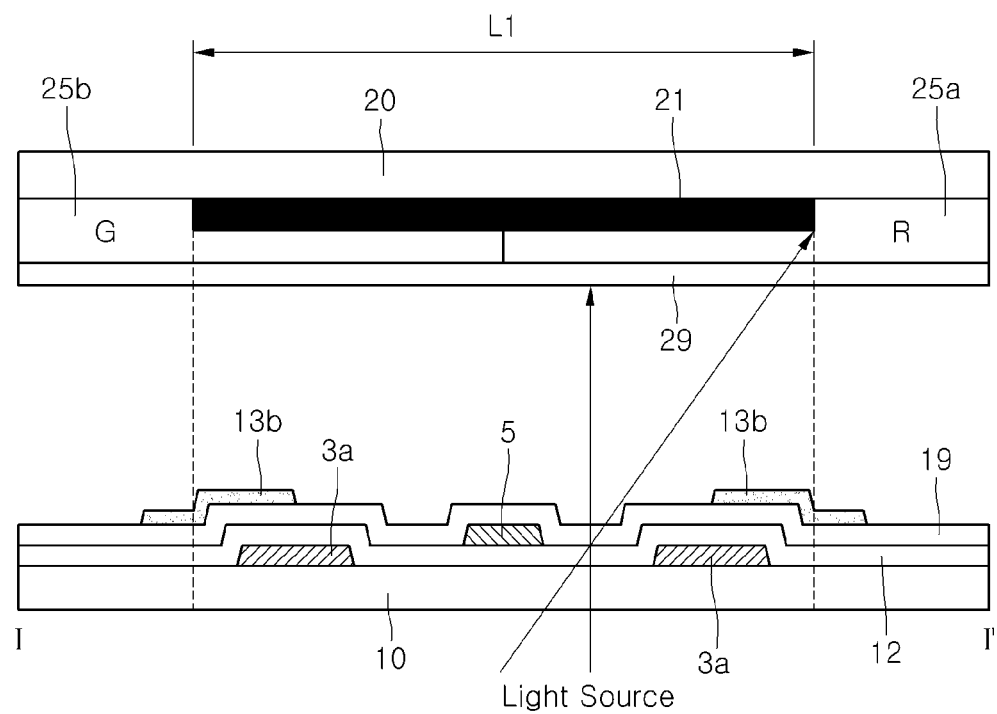
FIG. 2 is a cross-sectional view schematically showing the pixel structure taken along a line I-I' in FIG. 1.

Reference will now be made in detail to the preferred embodiments of the present invention, examples of which are illustrated in the accompanying drawings. Moreover, it will be understood that when an element, such as a substrate, a layer, a region, a film, or an electrode, is referred to as being formed "on" or "under" another element in the exemplary embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

Figure 3A:
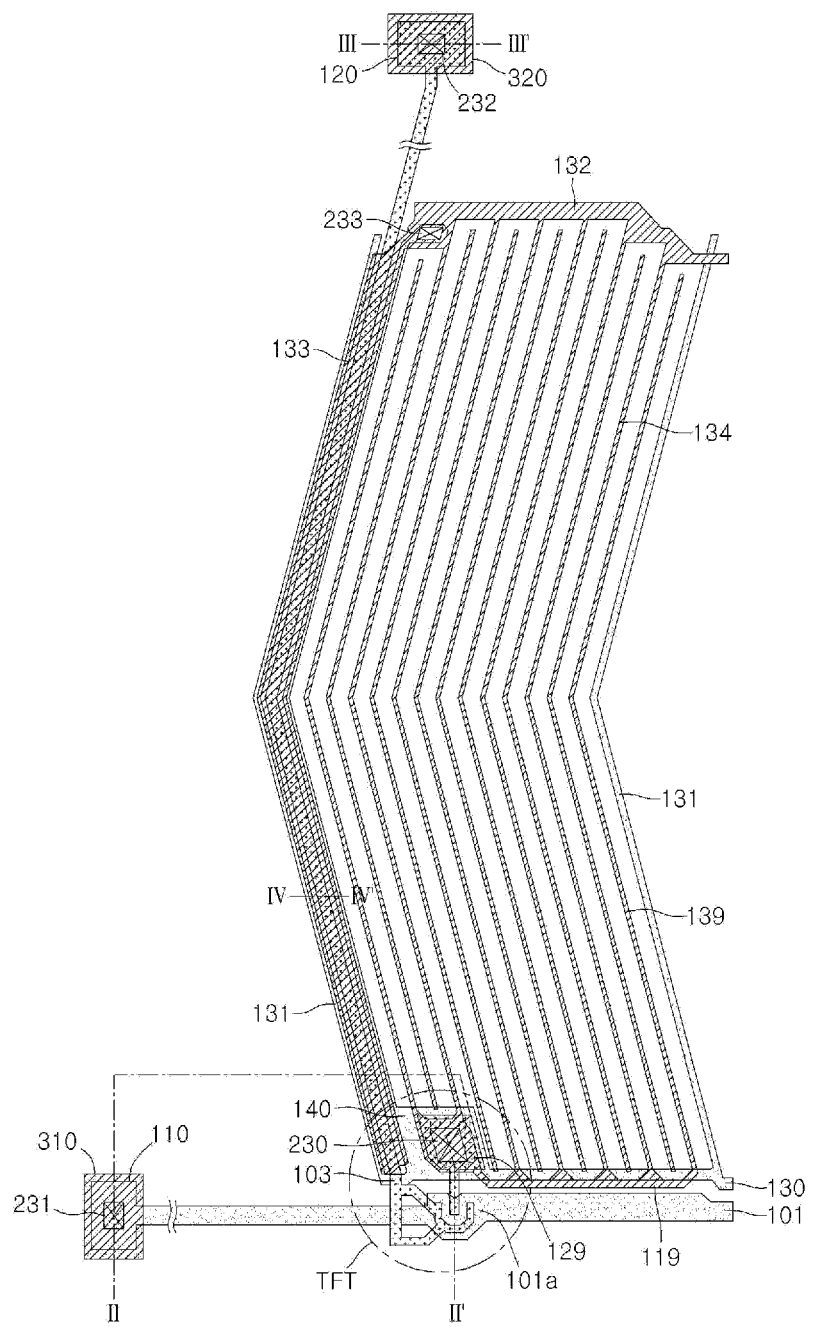
FIG. 3A is a view schematically showing a pixel region of an LCD device according to a first exemplary embodiment of the present invention.
Figure 3B:
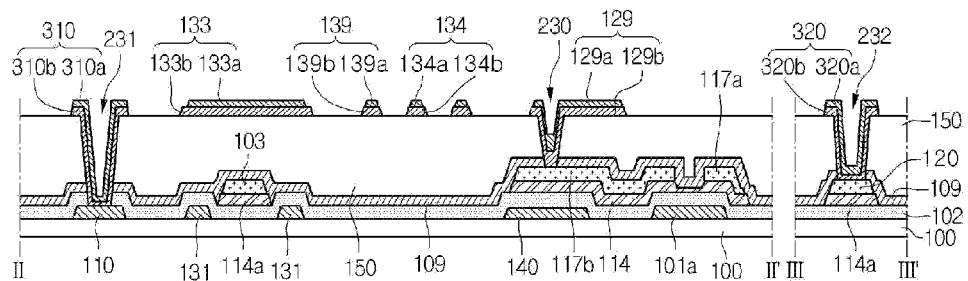
FIG. 3B is a cross-sectional view schematically showing the LCD device taken along lines II-II' and III-III' in FIG. 3A.

FIG. 3A is a view schematically showing a pixel region of an LCD device according to a first exemplary embodiment of the present disclosure. FIG. 3B is a cross-sectional view schematically showing the LCD device taken along lines II-II' and III-III' in FIG. 3A.

Referring to FIG. 3A, the pixel region of the LCD device according to the first exemplary embodiment of the present invention is defined by crossing a gate line 101 and a data line 103. A thin film transistor TFT is disposed at an intersection of the gate line 101 and the data line 103. A first common line 130 is disposed parallel to the gate line 101 at a position adjacent to the gate line 101. The first common line 130 also crosses the data line 103. The gate line 101 is formed to have a wider width at the position (area) where it crosses the data line 103 than the other position (area). The area of the gate line 101 with the wider width is used as a gate electrode 101a of the thin film transistor TFT. Thus, the gate electrode 101a and the gate line 101 are formed in a single body.

In the area where the thin film transistor TFT is formed, a first storage electrode 140 is formed to protrude from the first common line 130 toward the pixel region. A second storage electrode 129 is formed over the first storage electrode 140 in such a manner as to overlap the first storage electrode 140. The first and second storage electrodes 140 and 129 are used to form a storage capacitor. Although the first and second storage electrodes 140 and 129 are formed in a rectangular shape, the storage electrodes 140 and 129 may be formed in a variety of shapes, such as an ellipse, a triangle, and others, according to a desired capacitance value.

First common electrodes 131 are arranged at both sides of the pixel region. The first common electrodes 131 are branched from the first common line 130 and parallel to the data line 103. The first common electrodes 131 are disposed adjacent to the first common line 130. The first common electrode 131 at one side (at the left side of FIG. 3A) is also formed adjacent to the data line 103. (According to the description referring to the sectional views in FIG. 3B for example, two first common electrodes 131 in a pixel region are formed at both sides of the data line 103. Therefore, it can be said that the first common electrodes 131 are adjacent to the data line 103).

In the pixel region, a first pixel electrode 119 is formed to overlap the first common line 130, and a plurality of second pixel electrodes 139 are branched from the first pixel electrode 119 toward the pixel region and parallel to the data line 103. Each of the second pixel electrodes 139 is formed in a fine strip shape in the pixel region. The second pixel electrodes 139 are arranged at a fixed interval in the pixel region. The first pixel electrode 119 is formed in a single body with the second storage electrode 129. Therefore, the second pixel electrode 139 is also branched from the second storage electrode 129. In addition, the second storage electrode 129 is electrically connected to a drain electrode (117b of FIG. 3B) of the thin film transistor TFT through a first contact hole 230.

Also, a second common line 132 is formed opposite to the first common line 130 in the center of the pixel region. A plurality of second common electrodes 134 are branched from the second common line 132 toward the pixel region and parallel to the data line 103. Each of the second common electrodes 134 is formed in a strip shape. The second common electrodes 134 are alternately arranged with the second pixel electrodes 139 in the pixel region. The second common line 132 is electrically connected to an end portion of the first common electrode 131 that is branched from the first common line 130, through a fourth contact hole 233.

A third common electrode 133 is branched from one end of the second common line 132 in such a manner as to overlap the data line 103. The third common electrode 133 prevents light leakage caused by light which is generated in a light source of a backlight unit (not shown) and passes through a region of the data line 103. Also, the third common electrode prevents a reflection of external light on its surface. To this end, the third common electrode 133 may be formed from a material of low light reflectance.

Meanwhile, a gate pad 110 connected to the gate line 101 is formed in a pad area of the LCD device. A gate pad contact electrode 310 is formed over the gate pad 110. The gate pad contact electrode 310 electrically contacts with the gate pad 110 through a second contact hole 231. In addition, a data pad 120 connected to the data line 103 is also formed in the pad area. A data pad contact electrode 320 is formed over the data pad 120. The data pad contact electrode 320 electrically contacts with the data pad 120 through a third contact hole 232.

Referring to FIGS. 3A and 3B, the gate electrode 101a, the first storage electrode 140, and the common electrodes 131 are formed in a display area of a lower substrate 100 that may be formed from a transparent insulation material. The gate pad 110 is formed in the pad area corresponding to a non-display area of the lower substrate 100. The gate electrode 101a has a wider width than that of the gate line 101 because it may function as an electrode of the thin film transistor TFT.

As shown in FIG. 3B, a channel layer 114, a source electrode 117a and a drain electrode 117b are formed over the gate electrode 101a in the center of a gate insulation film 102. The data line 103 is formed on the gate insulation film 102 between the first electrodes 131 (referring to the cross-section taken along the line II-II' of FIG. 3A). A protective (or passivation) film 109 and an organic insulation film 150 are sequentially formed on the lower substrate 100 that is provided with the source/drain electrodes 117a/117b and the data line 103. The second storage electrode 129 is also formed on the organic insulation film 150 opposite to the first storage electrode 140. The second storage electrode 129 is electrically connected to the drain electrode 117b through the first contact hole 230. The third common electrode 133 is further formed on the organic insulation film 150 opposite to the data line 103. Moreover, the second pixel electrodes 139 and the second common electrodes 134 are alternately arranged on the organic insulation film 150 in the pixel region.

The gate pad 110 connected to the gate line 101 is formed on the gate pad area. The gate insulation film 102, the protective film 109, and the organic insulation film 150 are sequentially formed. The gate pad contact electrode 310 electrically connected to the gate pad 110 through the second contact hole 231 is formed on the organic insulation film 150. Also, the gate insulation film 102 is formed on the data pad area of the lower substrate 100. The data pad 120 extended from the data line 103 is formed on the gate insulation film 102. The protective film 109 and the organic insulation film 150 are sequentially formed on the data pad 120. The data pad contact electrode 320 electrically connected to the data pad 120 through the third contact hole 232 is formed on the organic insulation film 150. In addition, channel layer patterns 114a remain under the data pad 120 and the data line 103. This results from the fact that a metal film and the channel layer are continuously etched during an etching process using a diffraction mask or a half-tone mask.

The second storage electrode 129, the second pixel electrodes 139, the second common electrodes 134, the third common electrode 133, the gate pad contact electrode 310, and the data pad contact electrode 320, which are all formed after the formation of the organic insulation film 150, may each have a double-metal-layer structure. More specifically, the second storage electrode 129 may be configured to include an upper storage electrode layer 129a and a lower storage electrode layer 129b. Each of the second pixel electrodes 139 may be configured to include an upper pixel electrode layer 139a and a lower pixel electrode layer 139b Each of the second common electrodes 134 may be configured to include an upper common electrode layer 134a and a lower common electrode layer 134b. The third common electrode 133 may be configured to include an upper common electrode layer 133a and a lower common electrode layer 133b. The gate pad contact electrode 310 may be configured to include an upper gate pad contact electrode layer 310a and a lower gate pad contact electrode layer 310b. Also, the data pad contact electrode 320 may be configured to include an upper data pad contact electrode layer 320a and a lower data pad contact electrode layer 320b. Although they are not shown in the drawings, the first pixel electrode 119 and the second common line 132 may also be formed in the double-metal-layer structure.

The lower layers of the second storage electrode 129, the second pixel electrodes 139, the second common electrodes 134, the third common electrode 133, the gate pad contact electrode 310, and the data pad contact electrode 320 may be formed from one material that is selected from a group of molybdenum Mo, titanium Ti, tantalum Ta, Tungsten W, copper Cu, chrome Cr, aluminum Al, their alloys, and their combinations. For example, the lower layers may be formed from an alloy of molybdenum and titanium MoTi. On the other hand, the upper layers of the second storage electrode 129, the second pixel electrodes 139, the second common electrodes 134, the third common electrode 133, the gate pad contact electrode 310, and the data pad contact electrode 320 may be formed from copper nitride CuNx, that has a low reflection characteristic and a high conductivity If copper nitride CuNx is used to form the upper layers of the second storage electrode 129, the second pixel electrodes 139, the second common electrodes 134, the third common electrode 133, the gate pad contact electrode 310, and the data pad contact electrode 320, the third common electrode 133 located above the data line 103 can shield light from the light source toward the exterior, thereby reducing the reflectance of external light. Thus, the deterioration of picture quality caused by the light leakage defect and the diffused reflection of external light can be prevented.

In general, the alloy of molybdenum and titanium MoTi is a metal that is not prone to erosion. However, when the electrodes 129, 139, 134, 133, 310, and 320 are all formed in the double-metal-layer structure, a galvanic effect may be caused by electrons that are robbed from the lower layer of MoNx due to the upper layer of CuNx, and thus the erosion occurs. As such, a fine electrode may be formed by using the above galvanic effect. In other words, the second pixel electrode 139 and the second common electrode 134 each having the strip shape may be formed in a fine width because their upper and lower layers are formed by two metal layers different from each other.

The organic insulation film 150 may be formed from a material with a lower dielectric constant than the protective film 109. The organic insulation film 150 has a dielectric constant of about 3.0~4.0. Preferably, the dielectric constant of the organic insulation film 150 can become about 3.4~3.8. Also, the organic insulation film 150 can be in a thickness in the range of 3.5~6.0 μm. It is preferable for the organic insulation film 150 to have a thickness range of about 3.5~6.0 μm. Alternatively, the organic insulation film 150 can be designed in a variety of thicknesses according to a driving frequency of the LCD device which will be described below.

Also, the organic insulation film 150 may be formed from an acrylic-based resin. The acrylic-based resin includes a photo acryl, but it is not limited to this. In other words, if a material for the organic insulation film 150 has a low dielectric constant, the organic insulation is not limited to the photo acryl. The organic insulation film 150 formed from the low dielectric constant material can reduce a parasitic capacitance generated between the data line 103 and the third common electrode 133 and can reduce the load of the data line 103 as well. In fact, the third common electrode 133 according to the present exemplary embodiment may be disposed above the data line 103. Due to such a structure arrangement, a parasitic capacitance can be generated between the second pixel electrodes 139 adjacent to the data line 103. In this case, the organic insulation film 150 with the above dielectric constant characteristic can reduce the parasitic capacitance.

In detail, the third common electrode 133 shields electric fields that can be generated between the data line 103 and the second pixel electrodes 139 adjacent to the data line 103 and between the second pixel electrodes 139 adjacent to the data line 103. The closer the third common electrode 133 comes to the data line 103, the more superior the shielding function of the third common electrode 133 becomes. However, the parasitic capacitance also increases more. To address this matter, it is preferable for the organic insulation film 150 to have a possibly lowered dielectric constant. Moreover, the organic insulation film 150 may be formed in a variety of thicknesses according the driving frequency of the LCD device. The third common electrode 133 formed on the organic insulation film 150 opposite to the data line 103 forces the above parasitic capacitance to be generated between the third common electrode 133 and the data line 103. Such a parasitic capacitance causes a coupling effect between the third common electrode 133 and the data line 103 when a data voltage having different voltage levels is continuously applied to the data line 103.

As the driving frequency becomes higher, the coupling effect generated between the data line 103 and the third common electrode 133 enables the data voltage to be delayed on the data line 103. The present exemplary embodiment employing the organic insulation film 150 with the low dielectric constant reduces the parasitic capacitance between the data line 103 and the third common electrode 133. Therefore, the delay of signals can be prevented. More specifically, the parasitic capacitance is inversely proportional to the distance between the data line 103 and the third common electrode 133. Therefore, the parasitic capacitance becomes lower as the thickness of the organic insulation film 150 is enlarged. As a result, the signal delay caused by the coupling effect between the data line 103 and the third common electrode 133 can be reduced.

For example, if the driving frequency of the LCD device is set to 120 Hz, the thickness of the organic insulation film 150 can be in a range of about 2.5~3.5 μm. Alternatively, the thickness of the organic insulation film 150 can be in a range of about 5.5~6.5 µm when the LCD device has a driving frequency of 240 Hz. In this way, since the thickness value is not set to a fixed value for designing the LCD device, it can be varied along a specification of the LCD device. Also, it is necessary to change the position of the third common electrode 133, in order to prevent light leakage and improve the aperture ratio. In this case, the organic insulation film 150 can be thinner or thicker according to the driving frequency.

FIGS. 4A to 4G are cross-sectional views, which show the cross-sections of a thin film transistor substrate taken along lines II-II' and III-III' in FIG. 3A, and explain a method of fabricating the thin film transistor array substrate.

Referring to FIGS. 4A to 4G, a metal film may be deposited on a lower substrate 100 of a transparent insulation material by a sputtering method. Then, a first mask process is performed to the metal film. In the first mask process, a photo-resist including a light sensitive material is initially formed on the deposited metal film. The photo-resist is exposed and developed using a mask that is defined into transmission regions and non-transmission regions, thereby providing a photo-resist pattern. Thereafter, the metal film is etched using the photo-resist pattern as a mask, thereby forming a gate electrode 101a, a first storage electrode 140, first common electrodes 131, and a gate pad 110 on the lower substrate 100. Although they are not shown in the drawings, a gate line (101 in FIG. 3A) and a first common line (130 in FIG. 3A) are also formed at the same time on the lower substrate 100. The gate line 101 may be formed in a single body with the gate electrode 101a. The first common line (130 in FIG. 3A) may be formed in a single body with the first common electrodes 131 and the storage electrode 140 (In fact, the first common electrodes 131 and the storage electrode 140 may be formed from the first common line 130 as described, and the gate electrode 101a may be formed from the gate line 101 and may be a part of the gate line 101 as described).

The metal film may be formed from one material that is selected from a group of molybdenum Mo, titanium Ti, tantalum Ta, Tungsten W, copper Cu, chrome Cr, aluminum Al, their alloys, and their combinations. Although the metal film may be formed in a single layer as shown in the drawings, the metal film may also be formed by stacking at least two metal layers when it is necessary.

Figure 4A:
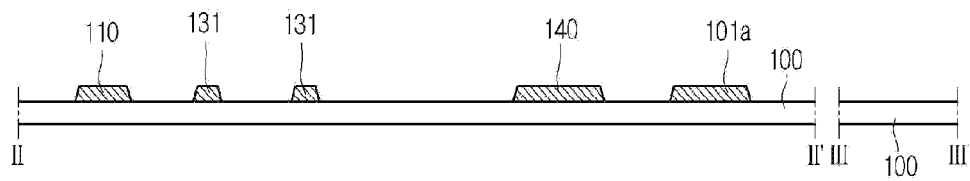
FIGS. 4A to 4G are cross-sectional views, which show the cross-section of a thin film transistor substrate taken along lines II-II' and III-III' in FIG. 3A, explaining a fabricating method of a thin film transistor array substrate of the first exemplary embodiment.
Figure 4B:
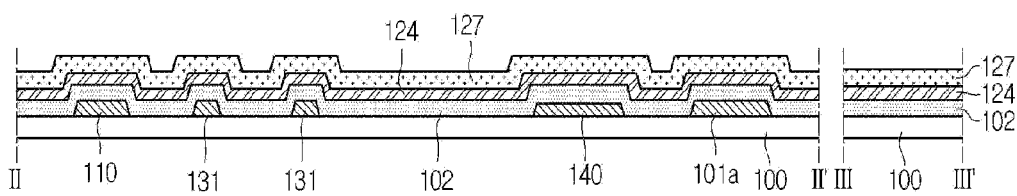

After the above electrodes and pad are formed on the lower substrate 100, a gate insulation film 102 of an amorphous silicon film and a semiconductor layer 124 of a doped amorphous silicon film (n+ or p+) are sequentially formed on the lower substrate 10 with the above-described electrodes 101a, 140 and 131 and pad 110, as shown in FIG. 4B. Subsequently, a source/drain metal film 127 is formed on the semiconductor layer 124.

The source/drain metal film 127 may be formed from one material that is selected from a group of molybdenum Mo, titanium Ti, tantalum Ta, Tungsten W, copper Cu, chrome Cr, aluminum Al, their alloys, and their combinations. Also, a transparent conductive material such as ITO (Indium Tin Oxide) may be used as the source/drain metal film 127. Moreover, although the source/drain metal film may be formed in a single layer as shown in the drawings, the source/drain metal film may also be formed by stacking at least two metal layers when it is necessary.

Figure 4C:
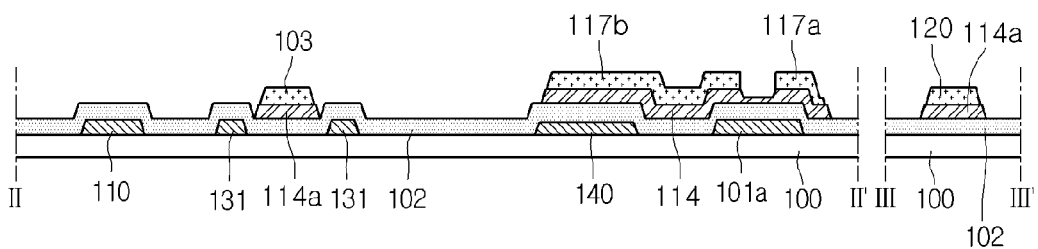

As shown in FIG. 4C, a second mask process using one of a half tone mask and a diffractive mask is performed for the lower substrate 100 covered with the source/drain metal film 127, in order to form source and drain electrodes 117a and 117b, a data line 103, a data pad 120, and a channel layer 114. The second mask process allows the source/drain metal film 127 and the semiconductor layer 124 under the source/drain metal film 127 to be sequentially etched. As such, the channel layer 114 is formed under the source and drain electrodes 117a and 117b to have the sizes corresponding to the source and drain electrodes 117a and 117b. The channel layer 114 may be also formed under the data line 103 and the data pad 120 to have the sizes corresponding to the data line 103 and the data 120. Moreover, the drain electrode 117b may be formed to overlap the first storage electrode 140, thereby forming a storage capacitor.

Figure 4D:
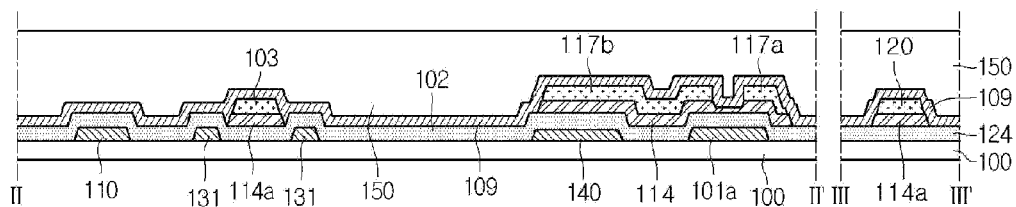

Afterward, as shown in FIG. 4D, a protective film 109 and an organic insulation film 150 are sequentially formed on the lower substrate 100 with the above-described structure. The organic insulation film 150 may have a lower dielectric constant than the protective film 109. The organic insulation film 150 may have a dielectric constant of about 3.0~4.0. It is preferable for the organic insulation film 150 to have a dielectric constant of about 3.4~3.8. Alternatively, the organic insulation film 150 may be designed in a variety of thicknesses according to a driving frequency of the LCD device, as mentioned in the description of FIGS. 3A and 3B. In addition, the organic insulation film 150 may be formed from an acrylic-based resin. The acrylic-based resin includes a photo acryl, but it is not limited to this. In other words, if a material for the organic insulation film 150 has a low dielectric constant, the organic insulation is not limited to the photo acryl.

Figure 4E:
Figure 4F:
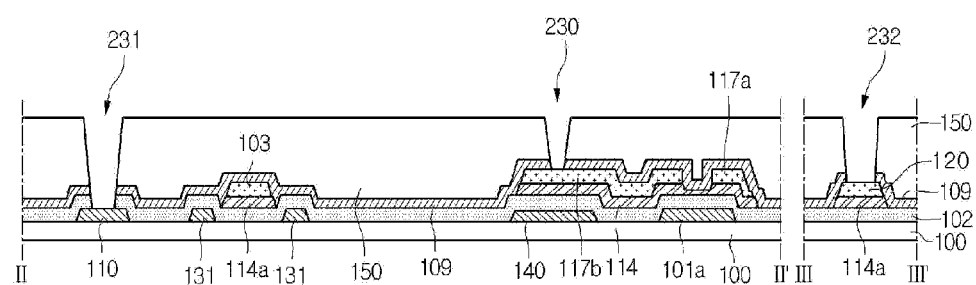

As shown in FIGS. 4E and 4F, a third mask process is performed for the lower substrate 100 covered with the organic insulation film 150 by using a mask 300 having transmission regions P1 and non-transmission regions P2. The third mask process allows the organic insulation film 150 to be patterned by exposing and developing steps. Also, the third mask process allows an etching step to be performed using the patterned organic insulation film 150 as an etching mask. As such, contact holes partially exposing the drain electrode 117b, the gate pad 110, and the data pad 120 are formed.

The contact holes includes a first contact hole 230 formed opposite to the drain electrode 117b, a second contact hole 231 formed opposite to the gate pad 110, and a third contact hole 232 formed opposite to the data pad 120. At the same time, although it is not shown in the drawings, a fourth contact hole 233 is also formed.

The first contact hole 230 and the third contact holes 232 only partially expose the protective film 109. Therefore, the exemplary embodiment of the present invention allows the etching step to be performed twice at the position opposite to the gate pad 110. Although it is not shown in the drawings, the fourth contact hole 233 may be also formed in the same structure as the second contact hole 231 to make the second common line 132 electrically connect to the first common electrode 131. In this regard, it is necessary to perform the etching step twice at the position opposite to the fourth contact hole 233. The two step etching will be explained later in detail referring to FIGS. 6A to 6C.

Figure 4G:
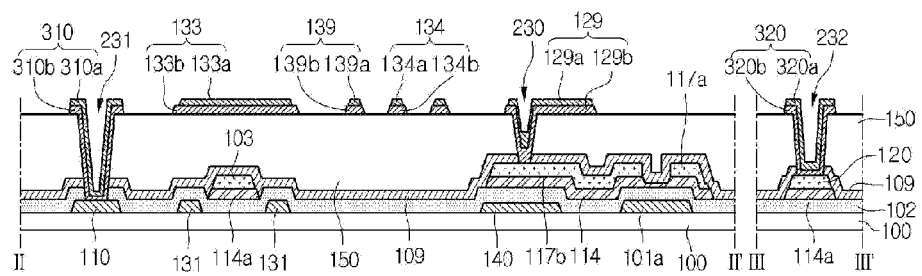

Next, first and second metal films are sequentially formed on the organic insulation film 150 where the contact holes 230 to 233 are formed before performing a fourth mask process, as shown in FIG. 4G. The fourth mask process allows coating, exposing, developing, and etching steps to be sequentially performed so that a storage electrode 129, second pixel electrodes 139, second common electrodes 134, a third common electrode 133, a gate pad contact electrode 310, and a data pad contact electrode 320 are formed in double-metal-layer structure. At the same time, although they are not shown in the drawing, the first pixel electrode 119 and a second common line 132 of FIG. 3A are also formed.

The first metal film may be formed from one material that is selected from a group of molybdenum Mo, titanium Ti, tantalum Ta, Tungsten W, copper Cu, chrome Cr, aluminum Al, their alloys, and their combinations. For example, an alloy of molybdenum and titanium MoTi may be used as the first metal film. On the other hand, the second metal film may be formed from a metal having a low reflection characteristic and a high conductivity. For example, copper nitride CuNx may be used as the second metal film.

As such, the second storage electrode 129 may be configured to include an upper storage electrode layer 129a and a lower storage electrode layer 129b. Each of the second pixel electrodes 139 may be configured to include an upper pixel electrode layer 139a and a lower pixel electrode layer 139b. Each of the second common electrodes 134 may be configured to include an upper common electrode layer 134a and a lower common electrode layer 134b. The third common electrode 133 may be configured to include an upper common electrode layer 133a and a lower common electrode layer 133b. The gate pad contact electrode 310 may be configured to include an upper gate pad contact electrode layer 310a and a lower gate pad contact electrode layer 310b. Finally, the data pad contact electrode 320 may also be configured to include an upper data pad contact electrode layer 320a and a lower data pad contact electrode layer 320b. Although they are not shown in the drawing, the first pixel electrode 119 and the second common line 132 of FIG. 3A may be also formed in the double-metal-layer structure. Moreover, the second pixel electrodes 139 and the second common electrodes 134 that are formed on the pixel region may be formed in a fine width because of the double-metal-layer structure.

Figure 5A:
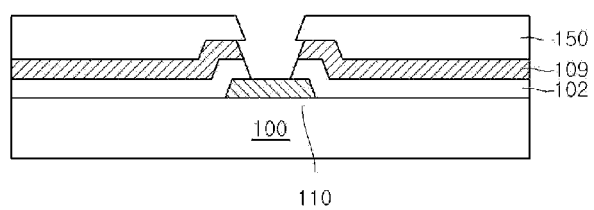
FIGS. 5A and 5B are views used to explain problems caused by applying the related art etching method to a contact hole formation process of the present invention.
Figure 5B:
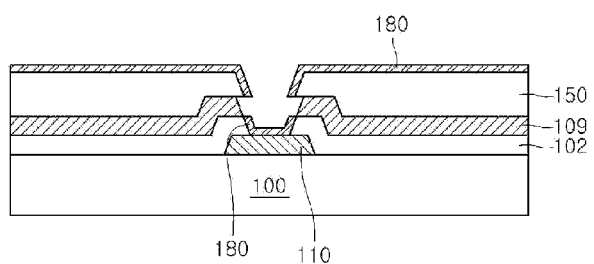

FIGS. 5A and 5B are views schematically illustrating problems caused by an etching method in the related art when it is used in the contact hole formation process of the present exemplary embodiment.

Referring to FIGS. 5A and 5B, the thin film transistor array substrate of the present exemplary embodiment includes the gate pad 110 that is formed in the gate pad region of the lower substrate 100. The thin film transistor array substrate is further configured to include the gate insulation film 102, the protective film 109, and the organic insulation film 150 that are formed on the gate pad 110.

In order to expose the gate pad 110, a dry etching process in the related art is employed. Also, residuals of the organic insulation film 150 remain within the hole after the exposing and developing process. Therefore, the inner side surface of the hole becomes rough due to the residuals of the organic insulation film 150. As shown in FIG. 5A, the residuals of the organic insulation film 150 forces an under cut structure to be formed in a lower portion of the organic insulation film 150. In other words, a step-coverage is generated among the organic insulation film 150, the protective film 109, and the gate insulation film 102.

The step-coverage generated within the hole causes a disconnection in a metal film 180 that will be formed later as shown in FIG. 5B. In fact, an electrical disconnection can be caused in a gate pad contact electrode of the present exemplary embodiment, which is formed in the gate pad region, by the step-coverage formed on the inner side wall of the contact hole. The metal film 180 may have a structure where at least two metal layers are stacked. To address this matter, the present exemplary embodiment varies a content ratio of an etching gas and performs the etching process twice during the formation of the contact hole.

Figure 6A:
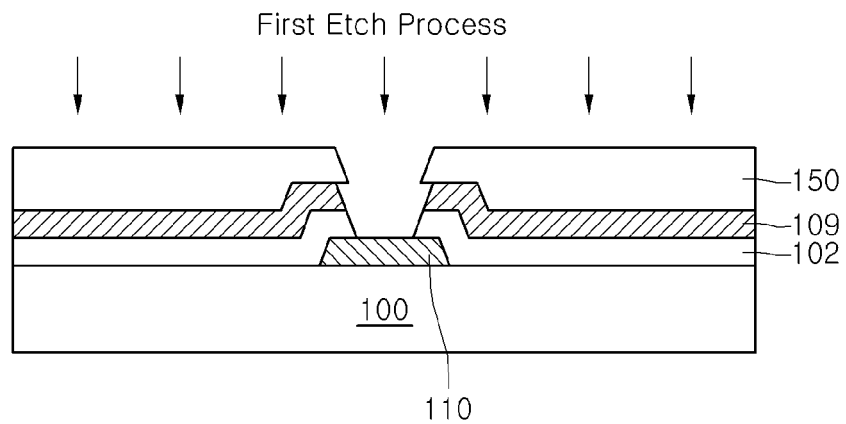
FIGS. 6A to 6C are views used to explain an etching process during a contact hole formation of the present invention.
Figure 6B:
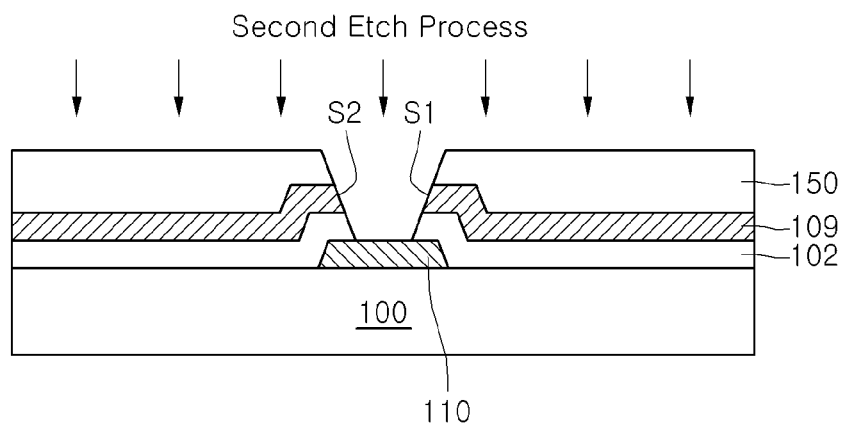
Figure 6C:
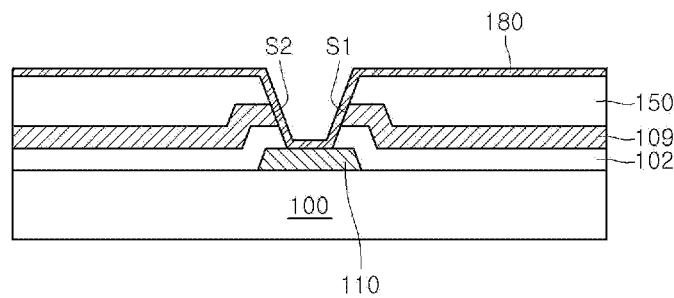

FIGS. 6A to 6C are views schematically illustrating an etching process during a contact hole formation of the present exemplary embodiment. As shown in FIGS. 6A to 6C, the gate pad 110 is formed on the lower substrate 100. Thereafter, the gate insulation film 102, the protective film 109, and the organic insulation film 150 are sequentially formed on the gate pad 110.

The organic insulation film 150 is patterned by a mask process before a first etching process is performed, the patterned organic insulation film will be used as a mask in the first etching process. A flow ratio of an etching gas of $SF_6:O_2$ used in the first etching process may be in a range of about 1:2.0-1:3.0. It is preferable for the etching gas of $SF_6:O_2$ to have a flow ratio of about 1:2.5. For example, if $SF_6$ corresponds to 4000, $O_2$ is in a range of about 10000~12000.

Subsequently, the flow ratio of the etching gas of $SF_6:O_2$ is varied and then a second etching process is performed. At this time, the flow ratio of $SF_6:O_2$ may be in a range of about 1:2.4-1:3.0. It is preferable for $SF_6:O_2$ to be set to a flow ratio of about 1:2.5. In other words, if the content of $O_2$ gas increases during the first and second etching processes, the rough of the inner side surface is improved. As such, it is preferable for the time for performing the second etching to be the same as or shorter than the time for performing the first etching.

As shown in FIG. 6B, first and second inclined surfaces S1 and S2 of the contact hole for the gate pad 110 are formed in a smooth surface. As such, the step-coverage is not generated among the organic insulation film 150, the protective film 109, and the gate insulation film 102. In addition, although the metal film 180 may be formed on the lower substrate 100 as shown in FIG. 6C, a disconnection is not generated in the metal film 180 within the contact hole for the gate pad 110. In this way, the third mask process of the present exemplary embodiment performs the etching process twice. As a result, no step-coverage on the inner side surface of the contact hole is generated.

Figure 7:
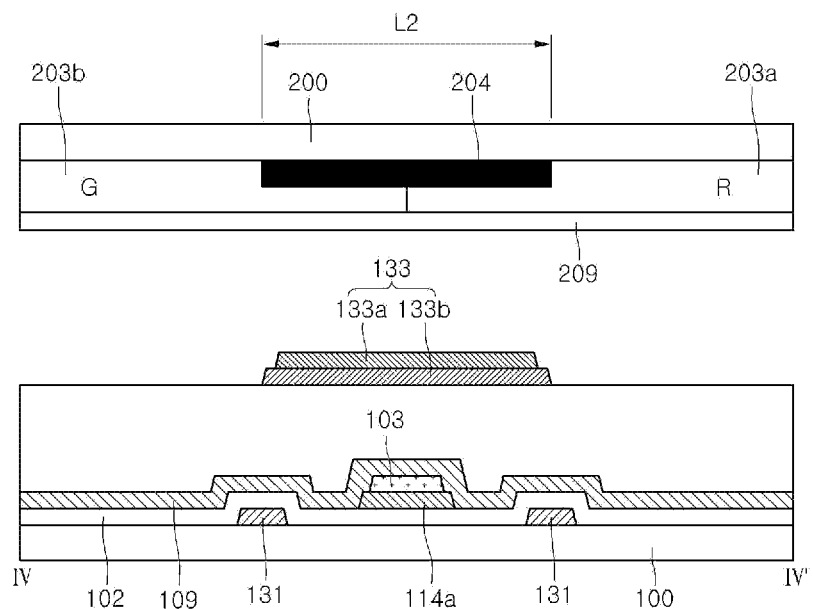
FIGS. 7 and 8 are views schematically showing a cross-sectional structure of the color filter substrate corresponding to a line IV-IV' in FIG. 3A.
Figure 8:
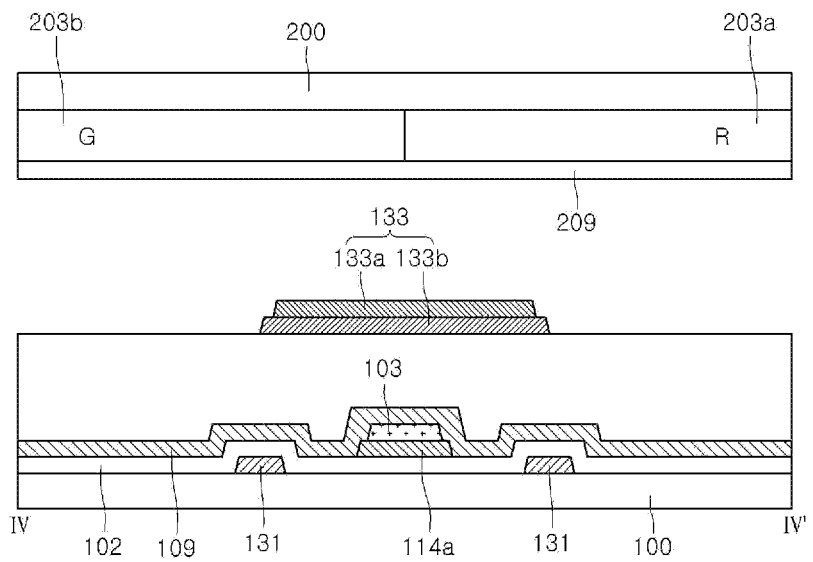

FIGS. 7 and 8 are views schematically showing a cross-sectional structure of the color filter substrate corresponding to a line IV-IV' in FIG. 3A. Referring to FIGS. 7 and 8, the cross-sectional structures of color filter array substrates according to the present exemplary embodiments may be formed opposite to a region of the data line 103.

The first common electrodes 131 may be formed on the lower substrate at both sides of the data line 103. The gate insulation film 102 may be formed between the data line 103 and the first common electrodes 131. The protective film 109 and the organic insulation film 150 may be sequentially formed between the data line 103 and the third common electrode 133. The third common electrode 133 disposed above the data line 103 may be used to shield light that progresses from a light source of the backlight unit under the lower substrate 100 toward an upper substrate 200. The third common electrode 133 may be configured to include an upper common electrode layer 133a and a lower common electrode layer 133b. The lower common electrode 133b may be formed from one material that is selected from a group of molybdenum Mo, titanium Ti, tantalum Ta, Tungsten W, copper Cu, chrome Cr, aluminum Al, their alloys, and their combinations. The upper common electrode 133a may be formed from copper nitride CuNx having a low reflection characteristic and a high conductivity.

The third common electrode 133 shields light entering from the rear surface of the lower substrate 100, thereby preventing light leakage. Also, the third common electrode 133 prevents the reflection of light, which enters from the exterior of the upper substrate 200 having a color filter layer. In this manner, the third common electrode 133, which is formed from a metal material and is able to shield light, is disposed above the data line 103. As such, a width L2 of a black matrix 204 formed on the upper substrate 200 can be reduced. Therefore, an aperture ratio of the pixel region is improved as the width L2 of the black matrix 204 is reduced.

The black matrix 204 of the upper substrate 200 opposite to the third common electrode 133 may be formed in a narrower width than the distance between the first common electrodes 131. Moreover, the width L2 of the black matrix 204 may be designed in a range from the width of the data line 103 to the distance between the first common electrodes 131. The reduced width L2 of the black matrix 204 allows the color filter layers, such as a red (R) color filter layer 203a and a green (G) color filter layer 203b to have a larger width (i.e., an enlarged size) between the black matrix 204, thereby increasing an aperture ratio of the pixel region.

The color filter array substrate of the present exemplary embodiment may be configured to not have the black matrix, as shown in FIG. 8. This results in the fact that light is shielded by the third common electrode 133. In this way, since the black matrix 204 is removed, processes of fabricating a color filter array substrate for the LCD device can be simplified. In addition, the aperture ratio of the pixel region can be also increased. Although not described in detailed, reference numeral "114a" and "209" represent a channel pattern and an overcoat layer respectively. Furthermore, the parasitic capacitance can be increased by the third common electrode 133 disposed above the data line 103. The organic insulation film 150 formed from a material, which has a lower dielectric constant than that of the protective film 109, can reduce the parasitic capacitance.

The LCD device and the method of fabricating the same according to the first exemplary embodiment, as described above, can be entirely or selectively applied to the other exemplary embodiments in the similar way. Therefore, the above description on the first exemplary embodiment will be applied to the other embodiments as follows.

Figure 9A:
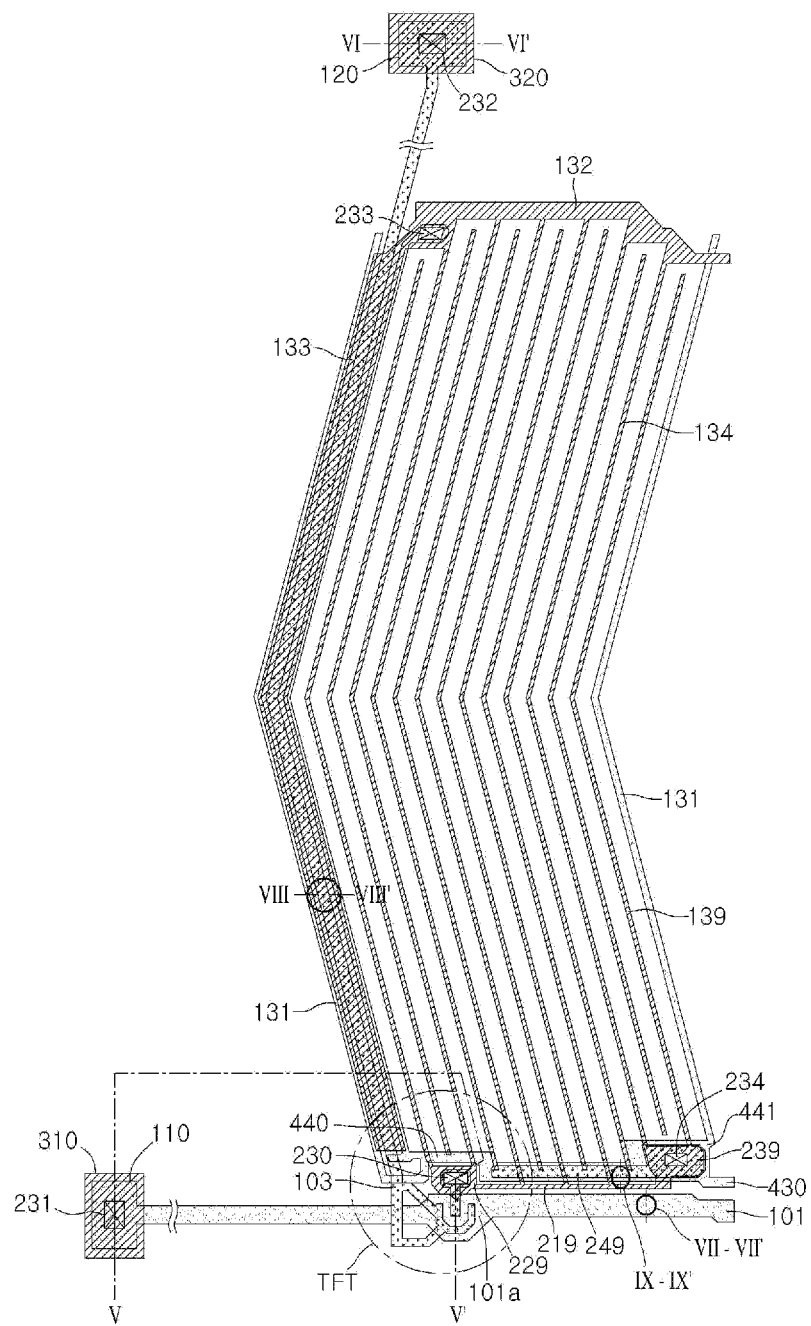
FIG. 9A is a view schematically showing a pixel region in an LCD device according to a second exemplary embodiment of the present invention.
Figure 9B:
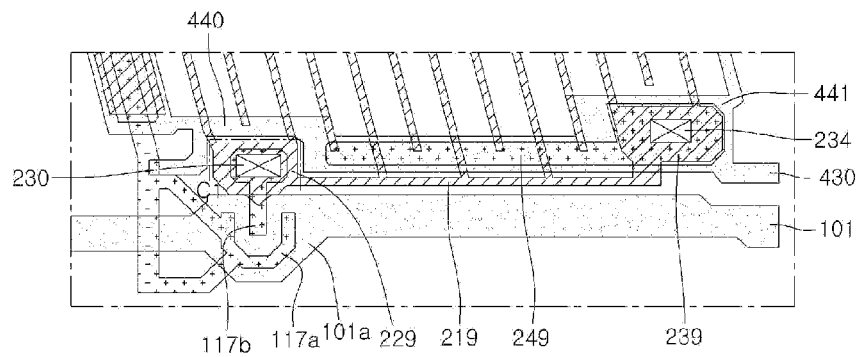
FIG. 9B is an enlarged view schematically showing a thin film transistor in FIG. 9A.

FIG. 9A is a view schematically illustrating a pixel region in an LCD device according to a second exemplary embodiment of the present invention. FIG. 9B is an enlarged view schematically illustrating a thin film transistor in FIG. 9A. The LCD device of the second exemplary embodiment shown in FIGS. 9A and 9B may be configured in the same manner as that of the first exemplary embodiment. Therefore, the same elements in the LCD device of the second exemplary embodiment as those of the first exemplary embodiment in FIGS. 3A and 3B will be indicated by using the same reference numbers. Also, parts of the second exemplary embodiment distinguished from the first exemplary embodiment will be mainly described.

Referring to FIGS. 9A and 9B, the LCD device according to the second exemplary embodiment of the present invention forces a drain electrode 117b of a thin film transistor TFT and a first common line 430 not to cross each other. Therefore, a pixel repairing process can be easily performed for the LCD device of the second exemplary embodiment.

Within a pixel region where the thin film transistor TFT is formed, the first common line 430 is disposed parallel to the gate line 101. The first common line 430 is formed to include a bent portion 440 at a position where the drain electrode 117b of the thin film transistor TFT is formed. The bent portion 440 does not overlap the drain electrode 117b. If the first common line 430 does not overlap the drain electrode 117b, a storage capacitor cannot be formed in the pixel region. To address this matter, the LCD device of the second exemplary embodiment allows a first storage electrode 441 to be formed in the pixel region opposite to the bent portion 440 of the first common line 430. The first storage electrode 441 may be formed in a single body with the first common line 430.

Also, a second storage electrode 249 overlaps the first common line 430 and the first storage electrode 441. The second storage electrode 249 may be formed of the same metal layer as the source and drain electrodes 117a and 117b. Moreover, a first pixel electrode 219 is disposed parallel to the gate line 101 and the first common line 430. The first pixel electrode 219 may be configured to include a first expansion portion 229 and a second expansion portion 239 at its both ends. The first expansion portion 229 is electrically connected to the drain electrode 117b through a first contact hole 230 and does not overlap the bent portion 440 of the first common line 430.

In this manner, the LCD device of the second embodiment allows the first expansion portion 229 (the first expansion portion 229 is a part of the first pixel electrode 219 and is electrically connected to the drain electrode 117b) to be separated from the bent portion 440 of the first common line 430 in the center of a cutting line C1 for the pixel repair. Therefore, the first common line 430 does not make an electrically shortened circuit with the first pixel electrode 219 (or the drain electrode 117b), even though the first pixel electrode 219 and the second pixel electrode 139 are cut along the cutting line C1 by a laser beam in order to repair a pixel.

Also, the first and second pixel electrodes 219 and 139 are arranged on the organic insulation film, and therefore there is no need for a repairing process to open the organic insulation film. In other words, the LCD device according to the second exemplary embodiment of the present invention allows the repairing process to be performed without removing the organic insulation film, in a different way from a pixel repairing process of the related art in which the organic insulation film must be removed before cutting the drain electrode.

The second expansion portion 239 included in the second exemplary embodiment of the present invention is formed to extend from the first pixel electrode 219 and to overlap the first storage electrode 441. The second expansion portion 239 is electrically connected to the second storage electrode 249. Therefore, the LCD device according to the second exemplary embodiment of the present invention includes a storage capacitor formed between the first common line 430, the first storage electrode 441, and the second storage electrode 249.

FIGS. 10 to 13 are cross-sectional views, illustrating the cross-sections of a thin film transistor substrate taken along lines V-V' and VI-VI' in FIG. 9A, and a fabricating method of the thin film transistor array substrate according to the second exemplary embodiment of the present invention.

The fabricating method of the thin film transistor array substrate according to the second exemplary embodiment is performed in the similar manner as that of the first exemplary embodiment shown in FIGS. 4A to 4G. Therefore, the fabricating method of the second exemplary embodiment will be explained in the center of parts that are distinguished from those of the first exemplary embodiment.

Figure 10:
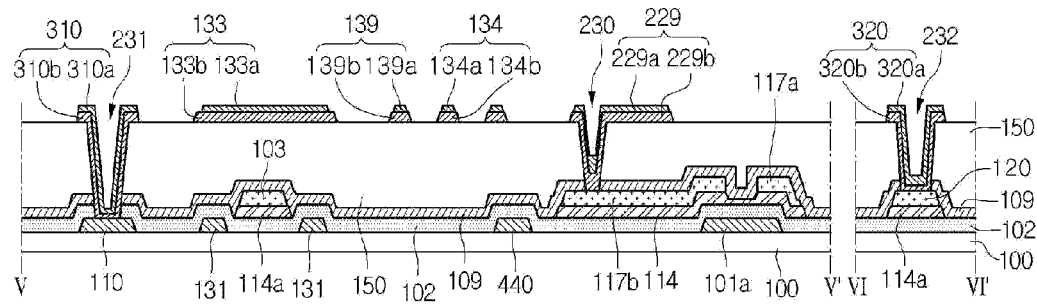
FIGS. 10 to 13 are cross-sectional views, which show the cross-sections of thin film transistor substrates taken along lines V-V' and VI-VI' in FIG. 9A, explaining thin film transistor substrates according to the exemplary embodiments of the present invention.

Referring to FIGS. 9B and 10, the fabricating method of a thin film transistor array substrate according to the second exemplary embodiment allows the first common line 430 and the drain electrode 117b of the thin film transistor TFT to be formed without overlapping each other. Also, there is no any overlapping portion existing between the drain electrode 117b and the bent portion 440 that is in a single body with the first common line 430. The first expansion portion 229 of the first pixel electrode 219 is electrically connected to the drain electrode 117b and may also be formed not to overlap the bent portion 440. The first expansion portion 229 may be configured to include an upper expansion layer 229a and a lower expansion layer 229b. As shown in FIG. 10, the first expansion portion 229, the second pixel electrodes 139, and a first pixel electrode 219 (of FIG. 9B) are all formed on the organic insulation film 150. Therefore, in order to repair a dark spot, the second pixel electrode 139 and the first pixel electrode 219 can be cut without removing the organic insulation film 150.

Figure 11:
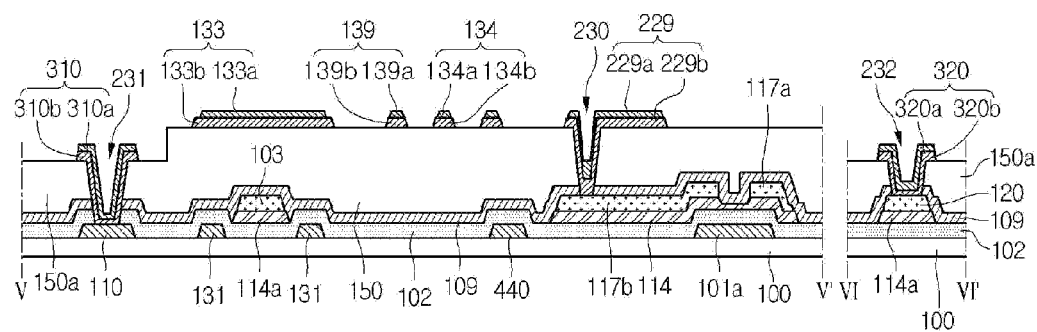

FIG. 11 illustrates an organic insulation film 150 formed in different thicknesses in a display area and a non-display area of the LCD device. In other words, an organic insulation film pattern 150a may be formed in a gate pad region and a data pad region of the non-display area in a different thickness from that of the organic insulation film 150 in the display area. In detail, the organic insulation film pattern 150a in the non-display area, where the gate and data pads are formed, has a smaller thickness than that of the organic insulation film 150 in the display area. This can be implemented by applying one of a half tone mask and a diffraction mask to a third mask process that forms the contact holes in the fabricating method illustrated in FIGS. 4A to 4G. In this way, the lowered height of the organic insulation film 150a in the pad regions results from the fact that the organic insulation film 150 is thicker than the protective film 109 and the gate insulation film 102. If the organic insulation film 150 is formed with a uniform height in both of the display and non-display areas, contact defects with terminals of an external driver integrated-circuit are generated. Therefore, the LCD device with the lowered organic insulation film in the pad regions makes an easy electrical contact with the terminals of an external driver integrated-circuit.

Figure 12:
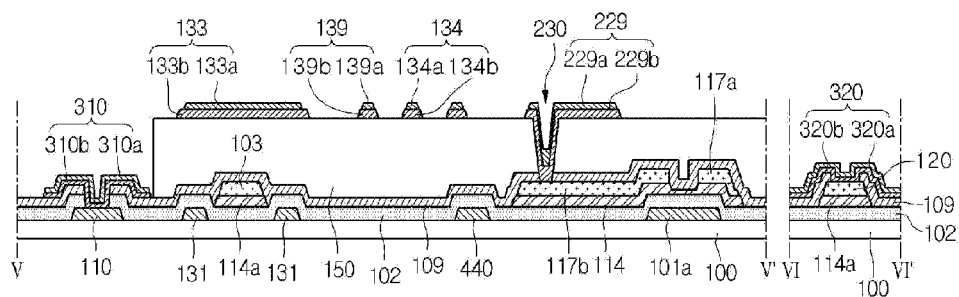

FIG. 12 illustrates a structure in which the organic insulation film 150 is completely removed from the gate and data pad regions. As such, a gate pad contact electrode 310 is formed on the protective film 109 and is electrically connected to the gate pad 110. Similarly, a data pad contact electrode 320 it is formed on the protective film 109 and is electrically connected to the data pad 120.

Figure 13:
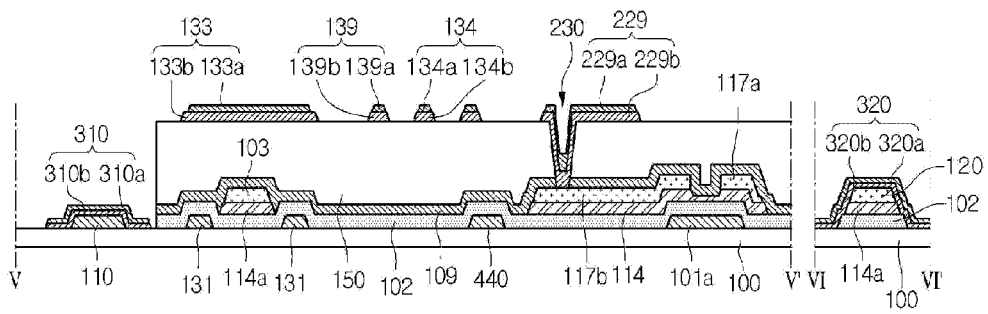

The thin film transistor array substrate of the second exemplary embodiment shown in FIG. 13 allows that the organic insulation film 150, the protective film 109, and the gate insulation film 102 may be completely removed from the gate pad region. Similarly, the organic insulation film 150 and the protective film 109 may be completely removed from the data pad region. Consequently, the gate pad contact electrode 310 may be directly formed on the lower substrate 100. The gate pad contact electrode 310 completely covers the gate pad 110. The data pad contact electrode 320 may be formed to encompass the gate insulation film 102, the channel layer pattern 114a, and the data pad 120, on the lower substrate 100. Similarly, the data pad contact electrode 320 may completely cover the data pad 120, the channel layer pattern 114a, and the gate insulation film 102.

In these ways, the fabricating method of the second exemplary embodiment implements a variety of structures on the pad regions of the LCD device without an additional mask process.

Figure 14A:
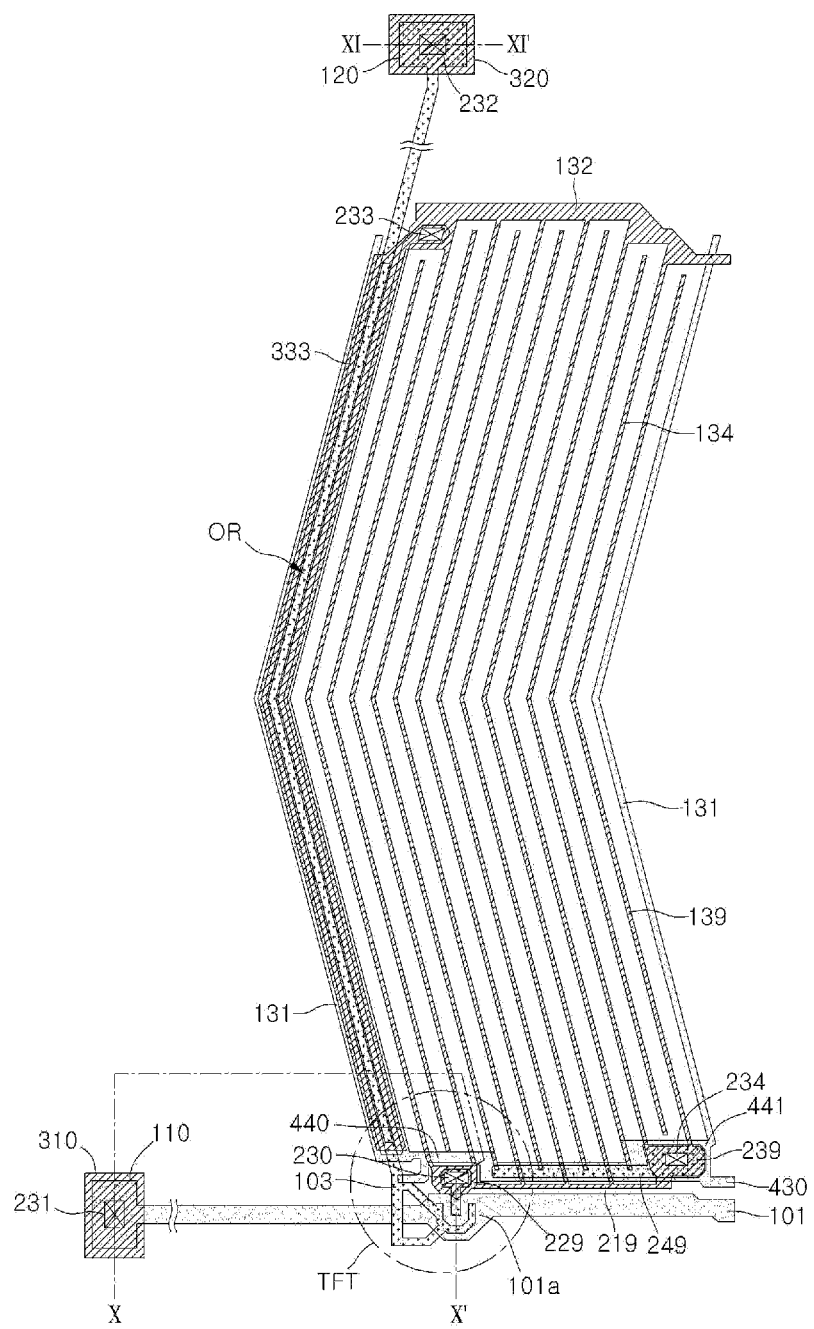
FIG. 14A is a view schematically showing a pixel region in an LCD device according to a third exemplary embodiment of the present invention.
Figure 14B:
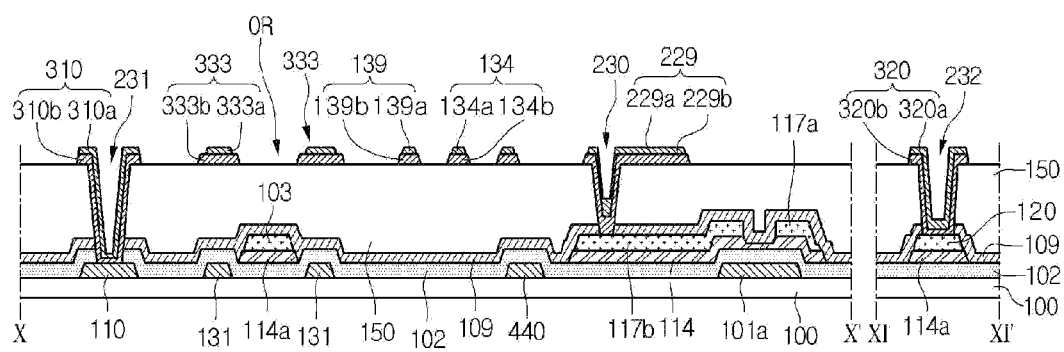
FIG. 14B is a cross-sectional view schematically showing an LCD device taken along lines X-X' and XI-XI' in FIG. 14A.

FIG. 14A is a view schematically illustrating a pixel region in an LCD device according to a third exemplary embodiment of the present invention. FIG. 14B is a cross-sectional view schematically illustrating an LCD device taken along lines X-X' and XI-XI' in FIG. 14A. The LCD device of a third exemplary embodiment may be configured to include a modified pixel structure derived from that of the second embodiment.

Referring to FIGS. 14A and 14B, the LCD device of the third exemplary embodiment of the present invention is provided with an opening region OR in a third common electrode 333 that is formed above the data line 103. The pixel and common electrodes included in the LCD device of the third exemplary embodiment may be formed from an opaque metal capable of shielding light. Therefore, it is difficult to identify a disconnection of the data line 103 that is generated within a pixel region during a fabricating process.

The LCD device of the third exemplary embodiment is based on that of the second exemplary embodiment. In addition, the LCD device of the third exemplary embodiment removes a part of the third common electrode 333 opposite to the data line 103 so that the data line 103 is visible as shown in FIG. 14B. The opening region OR may be preferably formed to have the same width as or a narrower width than that of the data line 103. Although they are shown in the drawings but not explained, the reference numerals "333a" and "333b" denote an upper common electrode layer and a lower common electrode layer, respectively.

Also, a black matrix may be formed on the color filter array substrate opposite to the data line 103 and the third common electrode 333, and may also be removed from the color filter array substrate, even though it is not shown in the drawings. The structures of the color filter array substrates illustrated in FIGS. 7 and 8 can be applied to the LCD device of the third exemplary embodiment. The data line 103 opposite to the opening region OR may be also formed from the opaque metal to shield light entered from the rear surface of the lower substrate 100. The opening region OR provided in the third common electrode 333 may be simultaneously formed when the second common line 132, the second common electrodes 134, the first pixel electrode 219, and the second pixel electrode 139 are formed. Such an LCD device according to the third exemplary embodiment can be applied to the first and second exemplary embodiments and the other exemplary embodiments which will be described later.

Figure 15A:
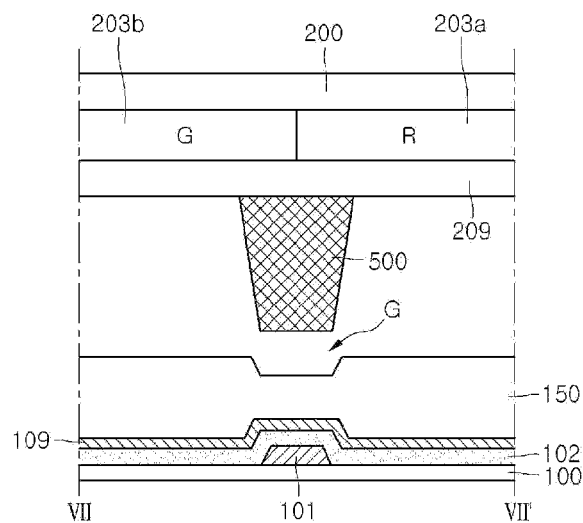
FIGS. 15A to 15C are cross-sectional views schematically showing spacers that are formed in regions corresponding to lines VII-VII', VIII-VIII', and IX-IX' in FIG. 9A.
Figure 15B:
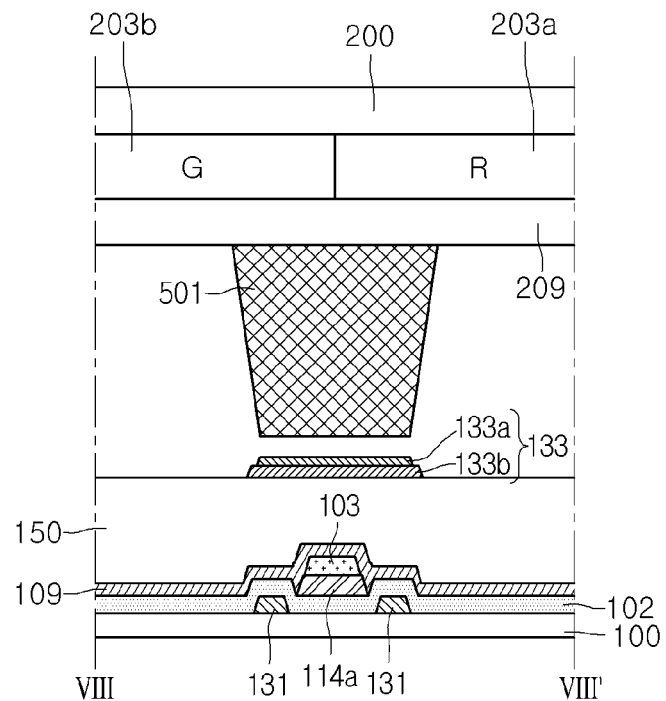
Figure 15C:
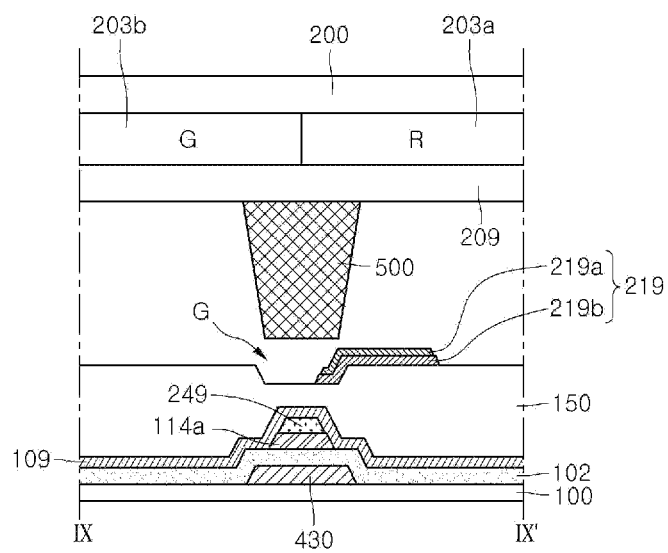

FIGS. 15A to 15C are cross-sectional views schematically illustrating spacers that are formed on regions corresponding to lines VII-VII', VIII-VIII', and IX-IX' in FIG. 9A. The LCD devices of the present exemplary embodiments may be configured to include spacers of two types. As shown in FIG. 15B, one type of the spacer may be a gap spacer that maintains constantly a cell gap between a color filter array substrate and a thin film transistor array substrate. As shown in FIGS. 15A and 15C, the other type of the spacer may be a suppression spacer for preventing damage of the gap spacer by externally pressing. The positions of the gap spacer and the suppression spacer can be freely changed because the spacer is not limited to its position. FIGS. 15A to 15C mainly illustrate a color filter array substrate without a black matrix, but the LCD device with the spacers of two types can be applied to the color filter array substrate that has the black matrix as shown in FIG. 7.

Referring to FIG. 15A, a gate line 101 is formed on a lower substrate 100, and a gate insulation film 102, a protective film 109, and an organic insulation film 150 are sequentially formed on the gate line 101. On the other hand, a red (R) color filter layer 203a and a green (G) color filter layer 203b are formed on an upper substrate 200 opposite to the lower substrate 100. Also, an overcoat layer 209 may be formed on the red (R) color filter layer 203a and the green (G) color filter layer 203b. Furthermore, a suppression spacer 500 is formed on the overcoat layer 209 opposite to the gate line 101 formed on the lower substrate 100. In addition, a groove G is formed on the organic insulation film 150 opposite to the suppression spacer 500.

Similarly, as shown in FIG. 15C, a second storage electrode 249 is formed on the gate insulation film 102 opposite to a first common line 430. The second storage electrode 249 is disposed above the first common line 430. Also, another suppression spacer 500 is formed on the overcoat layer 209 opposite to the second storage electrode 249. Moreover, a first pixel electrode 219 may be formed on a part of the groove G and the organic insulation film 150 in such a manner so as to overlap a part of the first common line 430.

Referring to FIG. 15B, a first common electrode 131 is formed on the lower substrate 100, and a data line 103 is formed on the gate insulation film 102 in the center of the first common electrode 131. The data line 103 is disposed above the first common electrode 131. Also, a third common electrode 133 is formed on the organic insulation film 150 opposite to the data line 103. The third common electrode 133 is positioned above the data line 103.

A gap spacer 501 is formed on the overcoat layer 209 of the color filter array substrate opposite to the third common electrode 133. Although they are not shown in FIG. 15B, one alignment film may be formed on the upper substrate 200 provided with the gap spacer 501, and another alignment film may be formed on the lower substrate 100 provided with the third common electrode 133. As such, the gap spacer 501 is in contact with the color filter array substrate and the thin film transistor array substrate and maintains constantly a cell gap between the two substrates. In other words, the LCD device of the present exemplary embodiment maintains constantly the cell gap between the color filter array substrate and the thin film transistor array substrate by the gap spacer 501. However, when a part of the display area is pressed by an external force that is larger than a bearable force of the gap spacer 501, the gap spacer 501 may be broken or lose its restorative power.

To resolve this matter, the LCD device of the present exemplary embodiment may be configured to include the suppression spacers 500 as shown in FIGS. 15A and 15C. More specifically, only the gap spacer 501 primarily endures to maintain the cell gap when two combined substrates are pressed by an external force. The strength of external force allowing the cell gap to be maintained only by the gap spacer 501 corresponds to power enabling the end of the suppression spacer 500 to be in contact with the bottom surface of the groove G on the organic insulation film 150. After the end of the suppression spacer 500 is in contact with the bottom surface of the groove G, the gap spacer 501 maintains the cell gap between two substrates along with suppression spacer 500.

The suppression spacer 500 may be formed in the same height as the gap spacer 501 or of a lower height than that of the gap spacer 501. If the suppression spacer 500 and the gap spacer 501 are formed in different heights, the groove G opposite to the suppression spacer 500 can be removed from the organic insulation film 150. Also, the suppression spacer 500 and gap spacer 501 with the different heights may be formed through a mask process using one of a half tone mask and a diffraction mask. The spacers as illustrated in FIGS. 15A to 15C can be applied to all of the exemplary embodiments of the present invention.

Figure 16B:
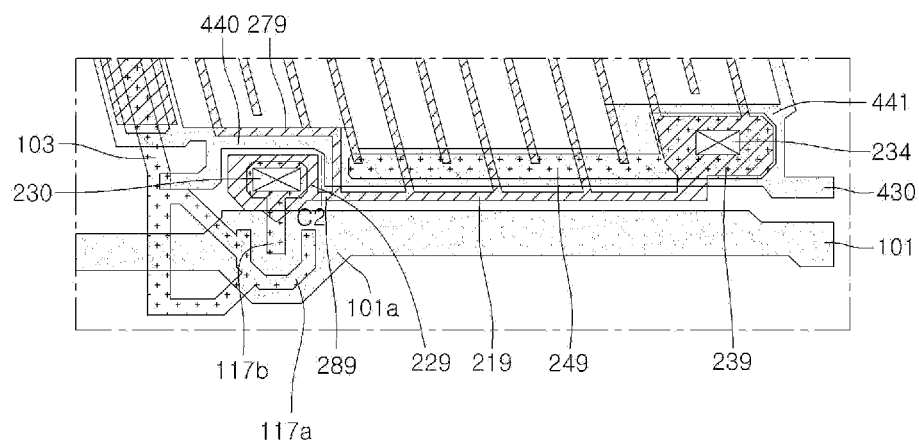
FIG. 16B is an enlarged view schematically showing a thin film transistor in FIG. 16A.

FIG. 16A is a view schematically illustrating a pixel region in an LCD device according to a fourth exemplary embodiment of the present invention. FIG. 16B is an enlarged view schematically illustrating a thin film transistor in FIG. 16A.

The LCD device of the fourth exemplary embodiment shown in FIGS. 16A and 16B may be configured in the similar manner as that of the second embodiment shown in FIGS. 9A and 9B. Therefore, the same elements in the LCD device of the fourth exemplary embodiment as those of the second exemplary embodiment will be indicated by using the same reference numbers. Also, parts of the fourth exemplary embodiment distinguished from the second exemplary embodiment will be mainly described.

Referring to FIGS. 16A and 16B, the LCD device according to the fourth exemplary embodiment of the present invention may be configured to include a modified structure allowing a pixel repairing process to become easier than that of the second exemplary embodiment.

Within a pixel region where the thin film transistor TFT is formed, the first common line 430 is disposed parallel to the gate line 101. The first common line 430 is formed to include a bent portion 440 at a position where the drain electrode 117b of the thin film transistor TFT is formed. The first common line 430 and the bent portion 440 do not overlap the drain electrode 117b.

If the first common line 430 does not overlap the drain electrode 117b, as described above, a storage capacitor cannot be formed in the pixel region. To address this matter, the LCD device of the fourth exemplary embodiment allows a first storage electrode 441 to be formed in the pixel region opposite to the bent portion 440 of the first common line 430. The first storage electrode 441 is formed in a single body with the first common line 430. In other words, the bent portion 440 is formed at one end of the first common line 430, and the first storage electrode 441 is formed at the other end of the first common line 430. Also, a second storage electrode 249 is formed to overlap the first common line 430 and the first storage electrode 441. The second storage electrode 249 may be formed of the same metal layer as the source and drain electrodes 117a and 117b.

Furthermore, a first pixel electrode 219 is disposed parallel to the gate line 101 and the first common line 430. The first pixel electrode 219 may be configured to include first expansion portions 229 and second expansion portion 239 at its both ends. More specifically, the LCD device according to the fourth exemplary embodiment of the present invention allows the first pixel electrode 219 and the first expansion portion 229 to be separated from each other in the center of a connection portion 289 in a region adjacent to the drain electrode 117b.

The first pixel electrode 219 is bent at the connection portion 289 so as to overlap the bent portion 440 of the first common line 430. The first expansion portion 229 is formed in a direction parallel to the gate line 101 and is electrically connected to the drain electrode 117b through a first contact hole 230. Therefore, the pixel repairing process for the LCD device of the fourth exemplary embodiment is realized by cutting the connection portion 289 along a cutting line C2. As such, the LCD device of the fourth exemplary embodiment makes it easier to repair a pixel in comparison with that of the second exemplary embodiment. Similar to the LCD device of the second exemplary embodiment, the LCD device of the fourth exemplary embodiment allows the pixel to be repaired by one cutting operation without removing the organic insulation film 150.

Figure 17A:
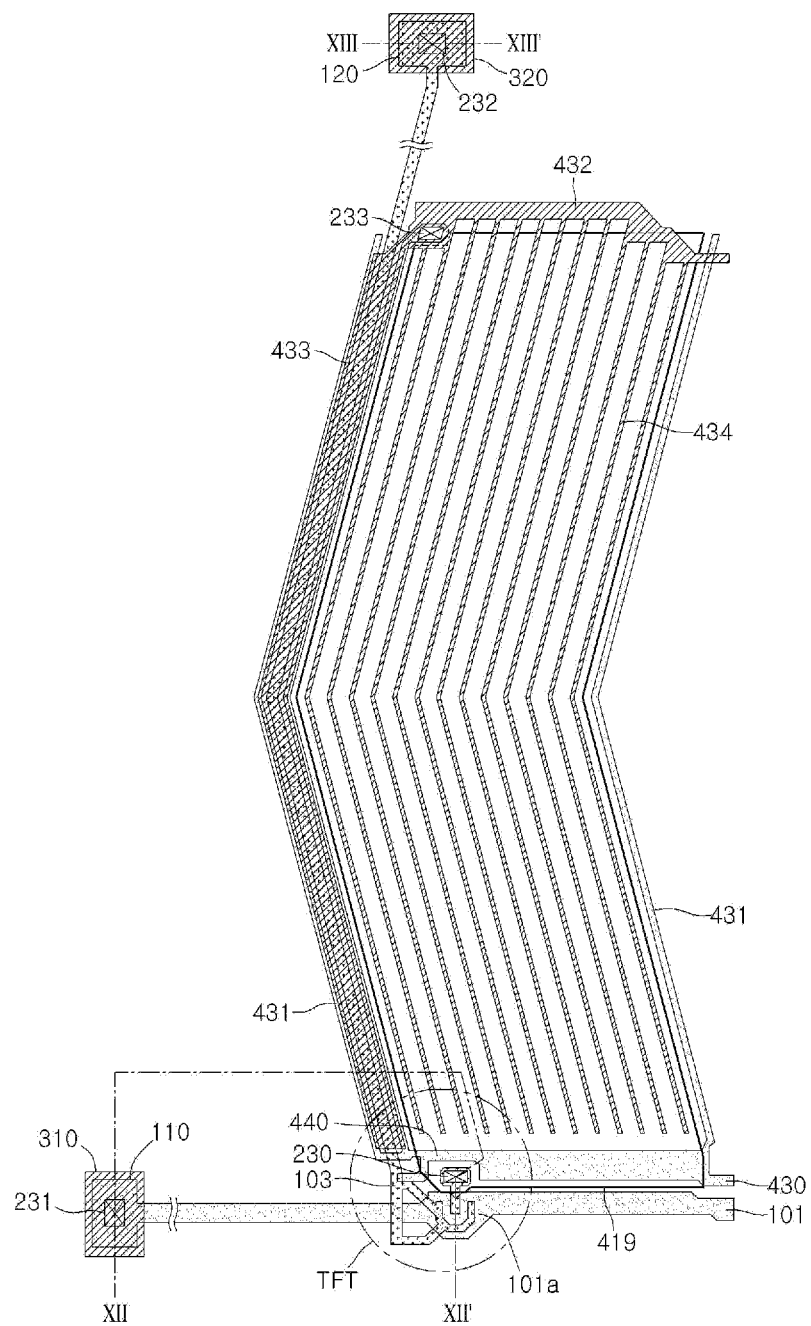
FIG. 17A is a view schematically showing a pixel region in an LCD device according to a fifth exemplary embodiment of the present invention.
Figure 17B:
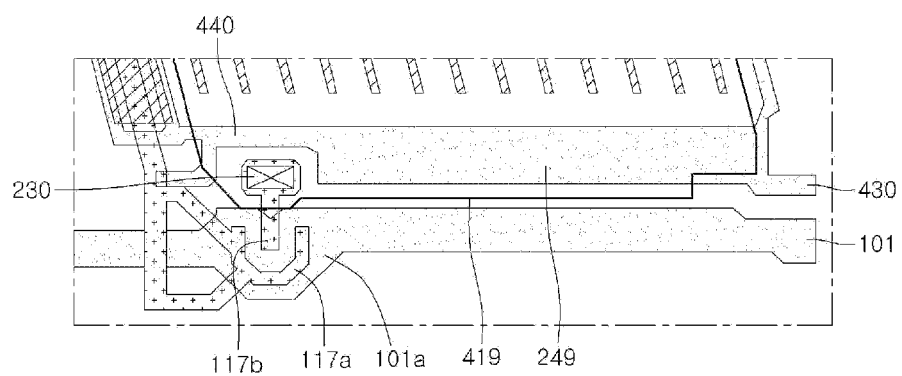
FIG. 17B is an enlarged view schematically showing a thin film transistor in FIG. 17A.

FIG. 17A is a view schematically illustrating a pixel region in an LCD device according to a fifth exemplary embodiment of the present invention. FIG. 17B is an enlarged view schematically illustrating a thin film transistor in FIG. 17A.

The fifth exemplary embodiment of the present invention is applied to an LCD device of the FFS (Fringe Field Switching) mode. The FFS mode LCD device of the fifth exemplary embodiment may be configured in a similar manner to that of the second exemplary embodiment shown in FIGS. 9A and 9B, but differs from that of the second exemplary embodiment in a structure of the pixel electrode in the pixel region. Therefore, the same elements in the fifth exemplary embodiment as those of the second exemplary embodiment will be indicated by using the same reference numbers. Also, parts of the fifth exemplary embodiment distinguished from the second exemplary embodiment will be mainly described.

Referring to FIGS. 17A and 17B, the LCD device according to the fifth exemplary embodiment includes a pixel region defined by crossing a gate line 101 and a data line 103. A thin film transistor TFT is formed at an intersection of the gate line 101 and the data line 103. Also, a first common line 430 is formed to include a bent portion 440 that is parallel to the gate line 101 and does not overlap a drain electrode 117b. Also, the LCD device according to the fifth exemplary embodiment allows an additional storage electrode for a storage capacitor not to be formed in the first common line 430. Moreover, a first common electrode 431 branched from the first common line 430 is disposed parallel to the data line 103. The first common electrode 431 is positioned adjacently to the data line 103.

Figure 18:
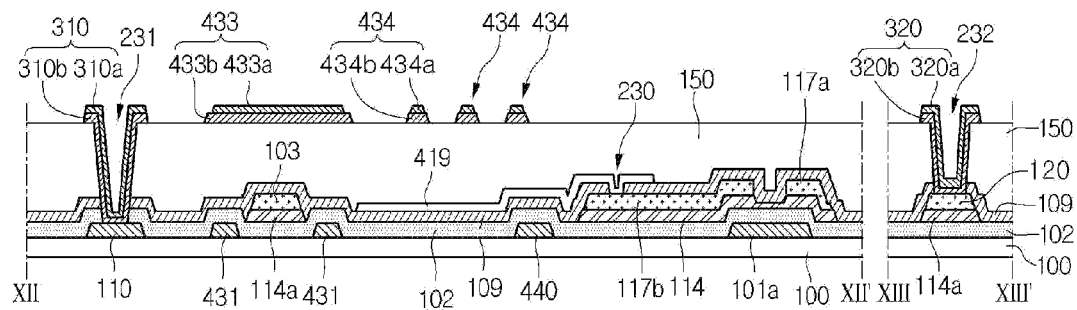
FIG. 18 is a cross-sectional view schematically showing the LCD device taken along lines XII-XII' and XIII-XIII' in FIG. 17A.

A pixel electrode 419 is formed in the pixel region. The pixel electrode 419 is formed in a plate structure and is electrically connected to the drain electrode 117b through a first contact hole 230. Such a pixel electrode 419 may be formed from a transparent conductive material, such as one of ITO, ITZO, and IZO. The pixel electrode 419 overlaps the first common line 430 so as to form a storage capacitor. In detail, the first common line 430 and the bent portion 440 are used as one electrode of the storage capacitor. The pixel electrode 419, which overlaps the first common line 430 and the bent portion 440, is used as the other electrode of the storage capacitor. Moreover, a second common line 432, a second common electrode 434, and a third common electrode 433 are formed above the pixel electrode 419. The second common electrode 434 is formed to include a plurality of strips that are branched from the second common line 432. The third common electrode 433 is formed to overlap the data line 103. The drain electrode 117b and the bent portion 440 of the first common line 430 are separated not to overlap each other. Therefore, a pixel repairing process is performed by cutting the pixel electrode 419 that is formed between the bent portion 440 and the drain electrode 117b FIG. 18 is a cross-sectional view taken along lines XII-XII' and XIII-XIII' in FIG. 17A. Referring to FIG. 18 together with FIGS. 17A and 17B, a gate electrode 101a and a bent portion 440 formed in a single body with a first common electrode 430 are formed on a lower substrate 100. A gate pad 110 and a first common electrode 431 branched from the first common line 430 are also formed on the lower substrate 100. The gate electrode 101a has a wider width than that of the gate line 101 because it is used as an electrode of a thin film transistor TFT.

A channel layer 114 and source and drain electrodes 117a and 117b are formed over the gate electrode 101a in the center of a gate insulation film 102. The data line 103 is formed on the gate insulation film 102 between the first electrodes 131 (referring to the cross-section taken along the line XII-XII'). A protective (or passivation) film 109 is formed on the lower substrate 100 that is provided with the source and drain electrodes 117a and 117b and the data line 103. A pixel electrode 419 is formed on the protective film 109. The pixel electrode 419 is electrically connected to the drain electrode 117b through the first contact hole 230. The pixel electrode 419 can be implemented by adding a contact hole forming process and a pixel electrode forming process to the fabricating method of the first exemplary embodiment after the protective film 109 is formed.

A second common electrode 434 and a third common electrode 433 are formed over the pixel electrode 419 in the center of an organic insulation film 150. In other words, the fabricating method of an LCD device according to the fifth exemplary embodiment of the present invention allows only the common electrodes to be formed on the organic insulation film 150. The second common electrode 434 is formed to include a plurality of strips that are arranged on the pixel region. Therefore, the LCD device according to the fifth exemplary embodiment of the present invention is driven by a vertical electric field between the pixel electrode 419 that is formed under the organic insulation film 150, and the second and third common electrodes 434 and 433 that are formed on the organic insulation film 150.

In the LCD device according to the fifth exemplary embodiment of the present invention, the pixel electrode 419 is formed in a plate structure, but it is just one example. Alternatively, the pixel electrode 419 may be formed on the protective film 109 in the same manner as the second common electrode 434. In other words, the pixel electrode 419 may be formed to include a plurality of strips. Also, the pixel electrode 419 is formed on the protective film 109, but it is not limited to this. In a different way, the pixel electrode 419 may be positioned on the lower substrate 100 at the pixel region or on the gate insulation film 102.

The third common electrode 433 is formed on the organic insulation film 150 opposite to the data line 103. Also, the gate pad 110 connected to the gate line 101 is formed in a gate pad area. The gate insulation film 102, the protective film 109, and the organic insulation film 150 are sequentially formed. The gate pad contact electrode 310, which is electrically connected to the gate pad 110 through the second contact hole 231, is formed on the organic insulation film 150. Furthermore, the gate insulation film 102 is formed on a data pad area of the lower substrate 100. The data pad 120 extended from the data line 103 is formed on the gate insulation film 102. The protective film 109 and the organic insulation film 150 are sequentially formed on the data pad 120. The data pad contact electrode 320 electrically connected to the data pad 120 through the third contact hole 232 is formed on the organic insulation film 150.

The second common electrode 434, the third common electrode 433, the gate pad contact electrode 310, and the data pad contact electrode 320, which are formed after the formation of the organic insulation film 150, all have a double-metal-layer structure. As such, the second common electrode 434 may be configured to include an upper common electrode layer 434a and a lower common electrode layer 434b. The third common electrode 433 is also configured to include an upper common electrode layer 433a and a lower common electrode layer 433b.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination within the scope of the disclosure, the drawings and the appended claims. In addition to variations and modifications in the component parts and/or arrangements, alternative uses will also be apparent to those skilled in the art.

What is claimed is:

1. A method of fabricating a thin film transistor array substrate to improve the aperture ratio of a pixel region, comprising:

forming a first metal layer on a substrate with a display area and a non-display area, and patterning the first metal layer into a gate electrode, a gate line, and a first common electrode that are arranged on the display area of the substrate, and a gate pad on the non-display area of the substrate through a first mask process;

sequentially forming a gate insulation film, a semiconductor layer, and a second metal layer on the substrate and forming source and drain electrodes, a second storage electrode, a channel layer, and a data line from the second metal layer and the semiconductor layer through a second mask process;

sequentially forming a protective film and an organic insulation film on the substrate, and patterning the patterning the organic insulation film by performing exposing and developing steps according to a third mask process;

sequentially performing first and second etching steps in which the patterned organic insulation film is used as an etch mask by using etching gases with different oxygen content ratios, in order to form contact holes in a drain electrode region, a gate pad region, and a data pad region; and sequentially forming a third metal layer and the fourth metal layer on the organic insulation film with the contact holes, and then patterning the third and fourth metal layers into a pixel electrode and a second common electrode through the fourth mask process, and wherein the organic insulation film is disposed between the pixel electrode and the second common electrode and the protective film in the pixel region.

2. The method claimed as claim 1, wherein the fourth mask process allows a third common electrode overlapping the data line to be formed on the organic insulation film.

3. The method claimed as claim 2, wherein the third common electrode is further configured to have an opening that is formed along the data line and exposes the data line.

4. The method claimed as claim 1, wherein the third mask process uses one of a half tone mask and a diffraction mask and enables the organic insulation film on the non-display area to have a smaller thickness than that of the organic insulation film on the display area.

5. The method claimed as claim 1, wherein the fourth metal layer is a low reflection metal layer that includes copper.

6. The method claimed as claim 1, wherein the etching gas of $SF_6:O_2$ used in the first etching step is in a flow ratio range of about 1:2.0-1:3.0.

7. The method claimed as claim 1, wherein the etching gas of $SF_6:O_2$ used in the second etching step is in a flow ratio range of about 1:2.4-1:3.0.

8. The method claimed as claim 1, wherein the inner side surface of the contact hole formed through the third mask process is formed in a same surface.

9. The method claimed as claim 1, wherein the pixel electrode and the second common electrode are contacted with the organic insulation film.

10. The method claimed as claim 1, wherein each of the pixel electrode and the second common electrode has a dual-layer structure.

* * * * *